United States Patent [19]

Meyers et al.

[11] Patent Number: 5,043,909

[45] Date of Patent: Aug. 27, 1991

[54] METHOD AND DEVICE FOR EXCESS MODULATION DETECTION FOR SIGNAL ANALYSIS

[75] Inventors: Clifford W. Meyers, Rancho Palos Verdes; Steven A. Biele, Harbor City; George R. Schwartz, Fountain Valley, all of Calif.

[73] Assignee: Hughes Aircraft Company, Los Angeles, Calif.

[21] Appl. No.: 292,286

[22] Filed: Dec. 30, 1988

[51] Int. Cl.$^5$ .................... G06F 15/20; G01R 23/00
[52] U.S. Cl. .................................. 364/484; 364/481; 364/578; 364/579
[58] Field of Search ............... 364/484, 485, 550, 553, 364/579, 480, 481, 578, 571.01–571.08; 324/76 R, 73 AT; 371/17, 20.1, 23

[56] References Cited

U.S. PATENT DOCUMENTS

| | | | |
|---|---|---|---|
| 4,301,404 | 11/1981 | Ley | 364/484 |
| 4,322,806 | 3/1982 | Allison | 364/485 |
| 4,595,992 | 6/1986 | Drogin | 364/484 |
| 4,807,161 | 2/1989 | Comfort et al. | 364/571.01 |

Primary Examiner—Kevin J. Teska
Attorney, Agent, or Firm—Leonard A. Alkov; Wanda K. Denson-Low

[57] ABSTRACT

An automated process and device for testing both C.W. and swept output signal modulation of a system or unit under test. The invention conditions the output signals to be compatible for measurement, measures incremental cycle periods of the signals using a continuous time counter, converts raw signal data into formatted tables, calculates prescribed parameters relating to the signals, aligns the calculated prescribed parameters relating to the signals, computes incremental signal frequencies from the incremental cycle periods as measured, substarts the incremental signal frequencies from the predicted signal frequencies to form a frequency residual model, constructs a curve using the incremental signal frequencies, and displays the curve. A prediction model is created and used to predict expected results. The prediction model defines ideal behavior of both C.W. and swept signals from a unit under test. The ideal behavior data is subtracted from the actual data, leaving a coarse representation of non-linearities. A combination of digital filtering, least squares curve fitting and the Choelsky method for solving simultaneous equations is used to refine coarse data into a frequency vs. time continuous curve or for other uses by the unit under test. The invention can be used for integrated circuit testing in manufacturing and incoming inspection of all types of fixed oscillators, all types of voltage controlled oscillators, and amplitude modulation and frequency modulation heterodyning chips, and instrument and module testing for manufacturing, incoming inspection, field test and diagnostics for function generators, sweep generators, oscillators and synthesizers.

9 Claims, 33 Drawing Sheets

METHOD AND DEVICE FOR EXCESS MODULATION DETECTION FOR SIGNAL ANALYSIS

BACKGROUND OF THE INVENTION

1. Field of the Invention

The present invention relates to a process and apparatus for signal analysis, and more specifically, for measuring modulation and non-linearities, for both continuous wave (C.W.) and ramped signals from a unit under test, such as a radar system.

2. Description of the Related Art

Prior art methods and devices for measuring modulation and non-linearties for linearly swept signals employ a delay line mixer scheme which provides a signal whose output is sensitive to the swept signals' slope and linearity. The frequency output signal of the mixer is proportional to the signal phase difference between the delayed and undelayed signals. The prior art method is generally embodied with some specific details as follows.

For radio frequency (RF) microwave signals containing frequency modulation (FM), the signal is frequency down-converted to a predetermined IF frequency. The IF signal has the FM characteristics originally present in the microwave output signal of a unit under test. The IF signal is then divided and part of the signal is input into an expensive precision delay line. The amount of delay is selected such that when the delayed signal is mixed with the original undelayed IF signal, a precise 2 KHz difference frequency will be output from the mixer (assuming the slope of the FM signal, delay line, and signal linearity are ideal). For different signal sweep rates, a different delay line is used. It should also be noted that for signals that are not at RF or microwave frequencies, no down-conversion is required. The signal is divided and fed into the delay line and the mixer combination directly.

The 2 KHz difference frequency signal is then converted into a form suitable for analysis by digital techniques employing amplification and limiting. Half of each 2 KHz signal pulse period digital signal is measured by using a 256-bit elapsed counter circuit. The value measured by the elapsed counter circuit is then stored. The stored result of the counter is then converted from a digital signal to an analog signal by an 8-bit ($2^8=256$) digital-to-analog converter for display on an oscilloscope. For example, if the swept signal ramp is 8 milliseconds in duration, there will be sixteen 2 KHz pulses which will be measured and displayed by the digital-to-analog converter. The digital-to-analog converter is updated for every 2 KHz signal pulse period.

If the signal ramp is linear and the reference signal frequency is less than the ideal 2 KHz, then at each period the phase difference increases by the same amount. The display is then an increasing staircase signal with equal-sized steps. As the reference frequency is increased, the steps become smaller in size until the display is a flat line.

The curvature of the signal representation on the display (with respect to a horizontal presentation) determines the non-linearity of the sweep. As the reference signal frequency is increased still more, the display becomes a downward staircase signal. A human operator adjusts the reference frequency signal until the last displayed data point intersects zero frequency on the display, and then reads the reference frequency on a frequency counter. The frequency measured is proportional to the average slope of the ramp of the signal. If the measured frequency is outside of the allowable frequency range, then the signal slope is not within prescribed specification.

Therefore, prior art inventions for swept signal linearity testing are generally performed with specially designed test panels. The test panels use a sophisticated technique of swept signal detection and analysis. This detection technique requires the use of an expensive precision delay line with expensive circuitry with substantial human operator interaction.

There are several disadvantages to the prior art technique. First, the precision delay line requires about forty five minutes to warm up for operation before measurements can be made. Second, the determination for pass or fail of the swept signal ramp is done manually with human operator intervention. Such intervention causes the measurements to be subjective and the accuracy of the measurements to rely upon skill of the operator. Third, even with skilled operators, the above described procedure is cumbersome and lengthy. Furthermore, the hardware used for prior art devices is special purpose, relatively inaccurate, and has limited adaptability for other uses.

Recent market requirements for desired signal test equipment, as in the radar test equipment art, dictate the need for automatic test equipment. Salient features of such desired equipment are: smaller size and lighter weight for depot, intermediate and organization testing; mobile and transportable; a high degree of automation (with minimal human operator intervention); and low cost.

Consequently, it would greatly benefit the art by employing an automated digital signal processing method and apparatus which would operate rapidly and would be inherently more repeatable, more accurate, and lower in cost.

SUMMARY OF THE INVENTION

The present invention seeks to overcome deficiencies in the prior art by providing an automated process and device for testing both C.W. and swept output signal modulation of a system or unit under test.

An advantage of the present invention is to provide an improved method and apparatus which employs an automated digital signal processing method so that the subjectivity of human operator intervention is eliminated and accuracy of results are not governed by the skill level of the operator.

Another advantage of the present invention is to provide rapid testing of both C.W. and swept signal modulation for devices or units under test; this will eliminate the requirement to wait a lengthy period of time until the test system warms up and stabilizes for operation.

Yet another advantage of the present invention is to decrease the size and weight of test systems as compared to existing test systems.

A further advantage is to provide a process for signal analysis for both C.W. and swept signals at a much lower cost. The hereabove-stated advantages of the present invention satisfy current market requirements in the art.

Some applications for the present invention include integrated circuit testing in manufacturing and incoming inspection for all types of fixed oscillators, all types of voltage controlled oscillators, and amplitude modulation and frequency modulation heterodyning chips; and instrument and module testing for manufacturing, incoming inspection, field test and diagnostics for function generators, sweep generators, oscillators and synthesizers.

Additional specific applications include radar and electronics testing for voltage control oscillators, reference oscillators, and signal demodulation; communications and navigations systems for digital FM demodulators, reference oscillators for carrier signals, and carrier signal drift and stability control. For particular airborne radar system applications, the technique of the present invention provides accurate hardware calibration to permit the measurement of distance (range) for fast moving airborne targets; the Frequency Modulated Range (FMR) techniques rely on swept radio frequency (RF) signals with highly linear sweeps (1 part in 33,000,000).

The invention can be described substantially in summary form as a process for signal analysis applied to both C.W. and swept signals from a unit under test generating prescribed parameters and predicted quantities, comprising: (1) conditioning the signals to be compatible for measurement; (2) measuring incremental cycle periods of the signals by a continuous time counter; (3) data conditioning by converting raw signal data into formatted tables of floating point number format; (4) calculating prescribed parameters relating to the signals; (5) aligning the calculated prescribed parameters relating to the signals with predicted quantities; (6) computing incremental signal frequencies from the incremental cycle periods as measured; (7) subtracting the incremental signal frequencies from the predicted signal frequencies to form a frequency residual quantity; (8) digitally filtering and generating signals representing or constructing a curve using the incremental signal frequencies; and (9) using the signals representing the curve to apply to other signals of the unit under test, or visually displaying the curve to a human operator. In specific embodiments of the invention, the prescribed parameter for C.W. signals is the carrier frequency of the signal; and the prescribed parameters for swept signals are the carrier frequency of the signal and the expected slope of the ramp of the signal. In other specific embodiments of the invention, a prediction model is created and used to predict expected results. The prediction model defines ideal behavior of both the C.W. and swept signals from the unit under test on an incremental cycle-by-cycle basis. The ideal behavior predicted by the model is then time aligned with the actual signal data. The ideal behavior data is then subtracted from the actual data leaving a coarse representation of the non-linearities. A combination of digital filtering, least squares curve fitting, and the Choelsky method for solving simultaneous equations is used to refine the coarse data into a frequency vs. time continuous curve or for other uses by the unit under test, such as self-test. This curve is then used to perform a final adjustment to the coarse slope calculation. The results are visually displayed. A prescribed display format is used in another embodiment of the invention.

The invention can also be embodied and described in substantially summary form as a device for signal analysis applied to modulated signals from a unit under test comprising: (1) means for conditioning the signals to be compatible for measurement; (2) continuous time counter for measuring the signals; (3) means for data conditioning the signals; (4) means for calculating prescribed parameters relating to the signals; (5) means for aligning calculated prescribed parameters with prescribed parameters; (6) means for computing incremental signal frequencies from the incremental cycle penaids as measured; (7) means for subtracting the incremental signal frequencies from the predicted signal frequencies to form a frequency residual quantity; (8) means for digitally filtering and constructing a curve using the residual signal frequencies; and (9) means for visually displaying the curve.

The above-described and other advantages of the present invention can best understood from an examination of the accompanying specification, drawing and claims hereto.

DETAILED DESCRIPTION OF THE INVENTION

Figure 1:
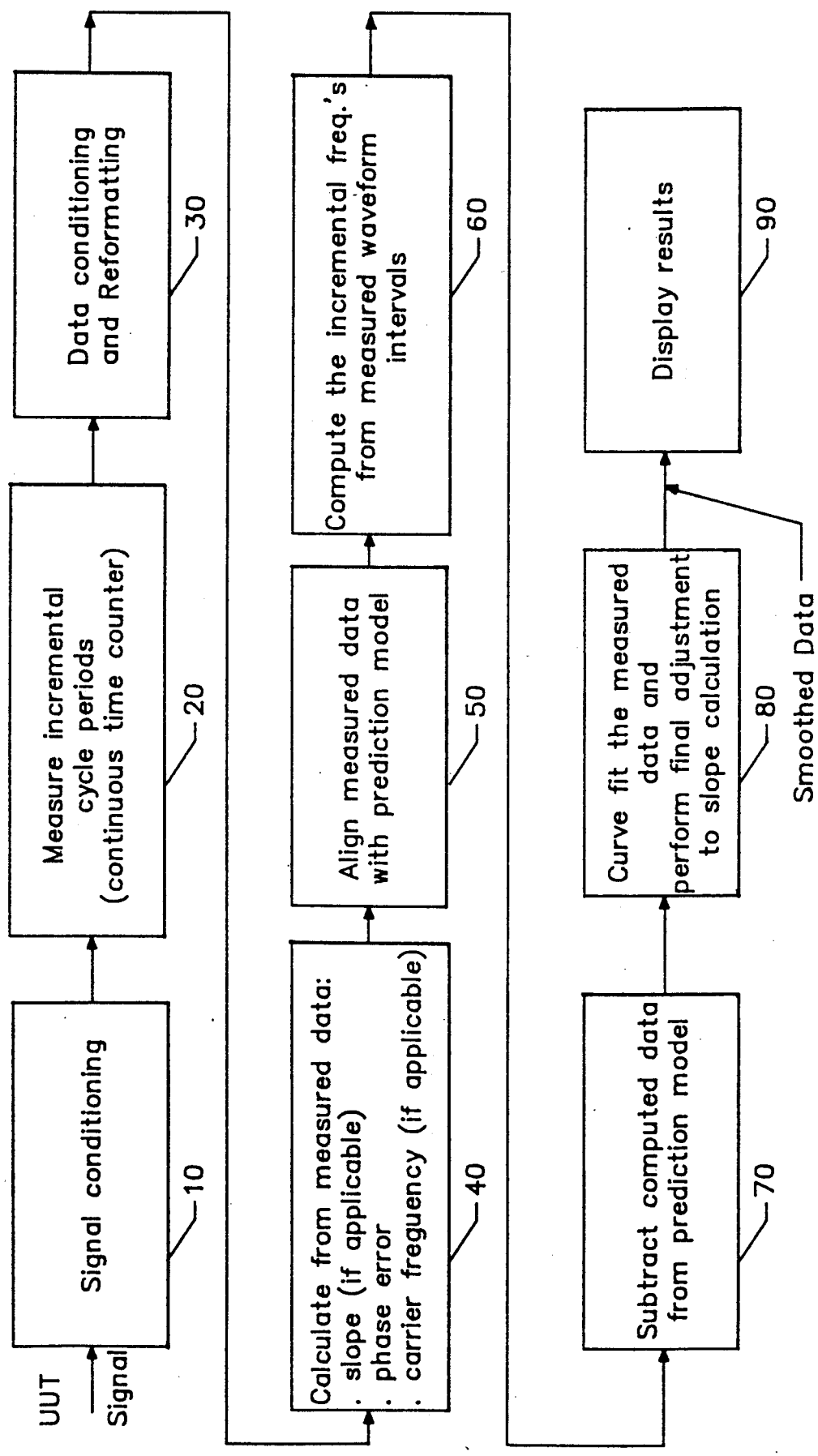
FIG. 1 is a functional block diagram of the functional signal flow of the present invention in process step and apparatus form.

The following description is provided to enable any person skilled in the art to which the present invention pertains, or with which it is most nearly connected, to make, and use the same and sets forth the best mode contemplated by the inventors of carrying out their invention. Various modifications, however, will remain readily apparent to those skilled in the art, since the generic principles of the present invention have been defined herein specifically to provide an automated signal analysis testing process and apparatus therefor.

The present invention is described in detail by the (1) Theory of the Invention; (2) Practice of the Invention with Best Mode; (3) Experimental Results; and (4) Use of the Invention.

(1) Theory of the Invention

The process of the invention requires rigorous signal conditioning combined with the determination of the average absolute frequency for each sinusoidal cycle over the entire period of the signal range. This average frequency is equal to an instantaneous signal frequency at the mid-point of each signal cycle (for both swept and C.W. signals). Since the C.W. case is a subset of the swept signal case, the derivation is based upon the more generic swept signal case. Using the derived equations for ideal swept signal ramp frequency and ideal cycles of the swept signal ramp waveform, a corresponding ideal swept signal ramp instantaneous frequency can be calculated. The difference between the actual and the ideal is the measured variance or error frequency.

The mathematical relationships between the number of cycles in the swept signal (for a given period of time) and the corresponding frequency associated with each cycle are set forth below.

$$F_I(t) = f_c + Kt$$

$f_c$ = signal carrier frequency in Hz
$K$ = swept signal ramp rate in Hz per second
$F_I(t)$ = Ideal frequency with respect to time The frequency of the swept signal and the cycles of the output waveform signals are related by integration by the following relationship:

$$N_I(t) = \int F_I(t) dt$$
$$= f_c t + (\tfrac{1}{2}) K t^2$$

$N_I(t)$ = ideal cycles with respect to time

Signal cycles may be measured using a complex instrument known as a continuous counter. The signal frequency deviation from the ideal signal must be measured. For this measurement, the following relationships are established:

$$F_A(t) = f_c + Kt + E(t)$$

$E(t)$ = undesired signal frequency modulation in the signal; error signal
$F_A(t)$ = actual (real) signal frequency with respect to time Then, the above frequency equation is converted to a "cycles" equation as follows:

$$N_A(t) = f_c t + (\tfrac{1}{2}) K t^2 + \int E(t) dt$$

$N_A(t)$ = actual (real) signal cycles with respect to time

The objective is to determine the FM error signal $E(t)$.

Assuming that the number of cycles that have occurred during the swept signal and the true interpulse time (period) of each of these cycles is accessible, a discrete differential equation can be established and the average frequency ($F_A$) of the swept signal for each cycle (with respect to time) can be derived:

$$\overline{F}_A = (\Delta N_A / \Delta t)$$
$$= f_c + Kt + (\tfrac{1}{2}) K \Delta t +$$
$$\left[ \int_0^{t + \Delta t} E(t) dt - \int_0^{t} E(t) dt \right] / \Delta t$$

$\overline{F}_A$ is not equal to the actual instantaneous frequency $F_A$. However, part of the averaging error, $(\tfrac{1}{2}) K \Delta t$ can be removed mathematically, because the ideal equations are known a priori and can be discretely differentiated:

$$\overline{F}_I = (\Delta N_I / \Delta t)$$
$$= f_c + Kt + (\tfrac{1}{2}) K \Delta t$$

$\overline{F}_A$ and $\overline{F}_I$ are time aligned, such that $\overline{F}_I$ can be subtracted from $\overline{F}_A$. The average error frequency ($\overline{F}_E$) for a given time interval is derived as follows:

$$\overline{F}_E = \overline{F}_A - \overline{F}_I$$
$$= \left[ \int_0^{t + \Delta t} E(t + \Delta t) - \int_0^{t} E(t) dt \right] / \Delta t$$

Since the error frequency varies slowly with respect to the swept signal itself and the number of cycles measured is large with respect to the residual error frequency ($F_E$), then $$\overline{F}_E \sim F_E$$

and $$F_E = E(t)$$

(2) Practice of the Invention with Best Mode

FIG. 1 depicts the present invention as an apparatus and as a process in functional step form. Unit under test 1 signal is signal conditioned. In the apparatus form of the invention the signal is applied to signal condition means 10 to make the signal compatible for measurement by continous time counter means 20. Data conditioning and re-formatting to floating point numbers format is accomplished by means 30. Signals are applied to means 40 for calculating prescribed signal attributes. From means 40, signals are applied to means 50 for aligning the calculated parameters with prediction model quantities. Signals are then applied to means 60 for computing incremental signal frequencies from incremental cycle periods. Signals are then applied to means 70 for subtraction and to means 80 for curve fit and slope adjustment, and finally to means 90 for display, or to a controller applied to or within unit under test 1 for use in making corrections to other signals.

More specifically, unit under test 1 output signal, the signal of a plurality of signals within unit under test 1 to be tested, is conditioned for further transformation. The signal may be an output signal from a radar system, as a unit under test, for example. In the apparatus form of the invention, the signal under test is applied to signal conditioning means 10. Signal conditioning means 10 adjusts its amplitude and band limits to its spectrum.

Next, as indicated in FIG. 1, the invention measures incremental/cycle periods of the signal using a continuous time counter technique. Counter 20 measures the signal periods and stores them in a table in its memory. The data represents the absolute time intervals between each waveform crossing (cycle) of the unit under test 1 output signal. This processing computer then reads the data stored in counter 20 and converts it to a floating point representation. At this point, data input by the human operator is used to determine whether the signal is C.W. or swept. If the signal is C.W., the prediction model reduces to a constant value over time. Otherwise, two parameters (sweep rate in Hz/sec and carrier frequency in Hz) are calculated and used to form an ideal model of the signal. In the apparatus form of the invention, signal output from signal conditioning means 10 is applied to continuous time counter 20 for measuring incremental cycle periods of the signal. The next step is to down-load the data stored in counter 20 to the computer and forward that data into a table for conversion to floating point representation numbers. The computer will then calculate prescribed parameter(s) relating to the signal. For C.W. signals, the prescribed parameter is the carrier frequency of the signal; and for swept signals, the prescribed parameters are the carrier frequency of the signal and the slope of the swept signal. In the apparatus form the invention, the signal output from continuous time counter 20 is applied to means 30 for data conversion to a table of floating point representation numbers. This table is then used for calculating prescribed parameters relating to the signals (means 40). The next step is time-aligning the measured signal parameters with predicted quantities calculated with a prediction (ideal) model. In the apparatus form of the invention, signals output from means 40 for calculating prescribed parameters are applied to alignment means 50. Next, incremental signal frequencies are calculated from incremental cycle periods, as measured. In the apparatus form of the invention, signal output from alignment means 50 is applied to means 60 to compute the incremental frequencies from the measured waveform intervals. The next step is to subtract the incremental signal frequencies from the predicted signal frequencies to form a frequency residual quantity. In the apparatus form of the invention, signals output from means 60 are applied to means 70 to subtract computed signal quantities from predicted signal quantities. Next, a continuous curve is constructed using the frequency resisidual quantities, or signals representing such a curve are generated. In the apparatus form of the invention, signal output from means 70 is applied to curve fit means 80. The next step is to visually display the curve, in a particular format, such as frequency vs. time. In the apparatus form of the invention, signal output from curve fit means 80 is applied to display means 90, or to a controller applied to or within unit under test 1 for internal use in applying to, combining with, or correcting other signals.

Figure 8:
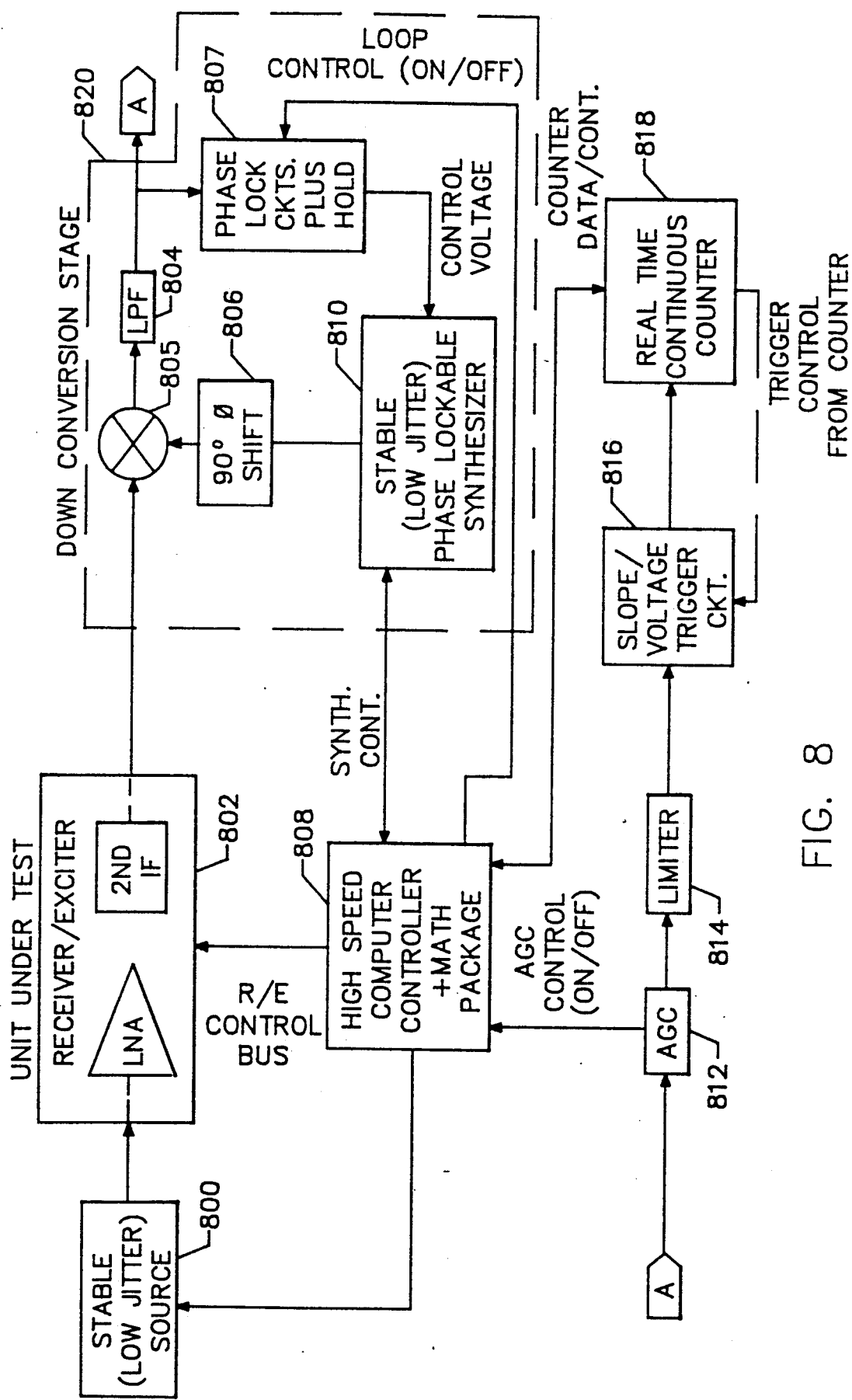
FIG. 8 is a block diagram illustrating in representative fashion the invention applied to a unit under test to test an output signal for illustrating the use of the invention.

The embodiment of each of the functional operations described in FIG. 1 is described in detail:
(a) Signal Conditioning
(b) Continuous Time Counter; and
(c) Data Conditioning and Reformatting The signal conditioning step and means 10 involves the automated set-up and control of an Automatic Gain Control (AGC) circuit and the signal limiter, as shown in FIG. 8. The AGC circuit is set to compensate for the varying levels of signals that can come from a down converter (MIXER). The AGC circuit will then provide the required gain to boost or attenuate the signal to provide the proper input to the limiter circuit. The limiter circuit provides a fixed gain to turn the sinusoidal signal into a pseudo square wave. This pseudo square wave is fed into the slope/voltage trigger circuits of the continuous time counter.

Figure 2A:
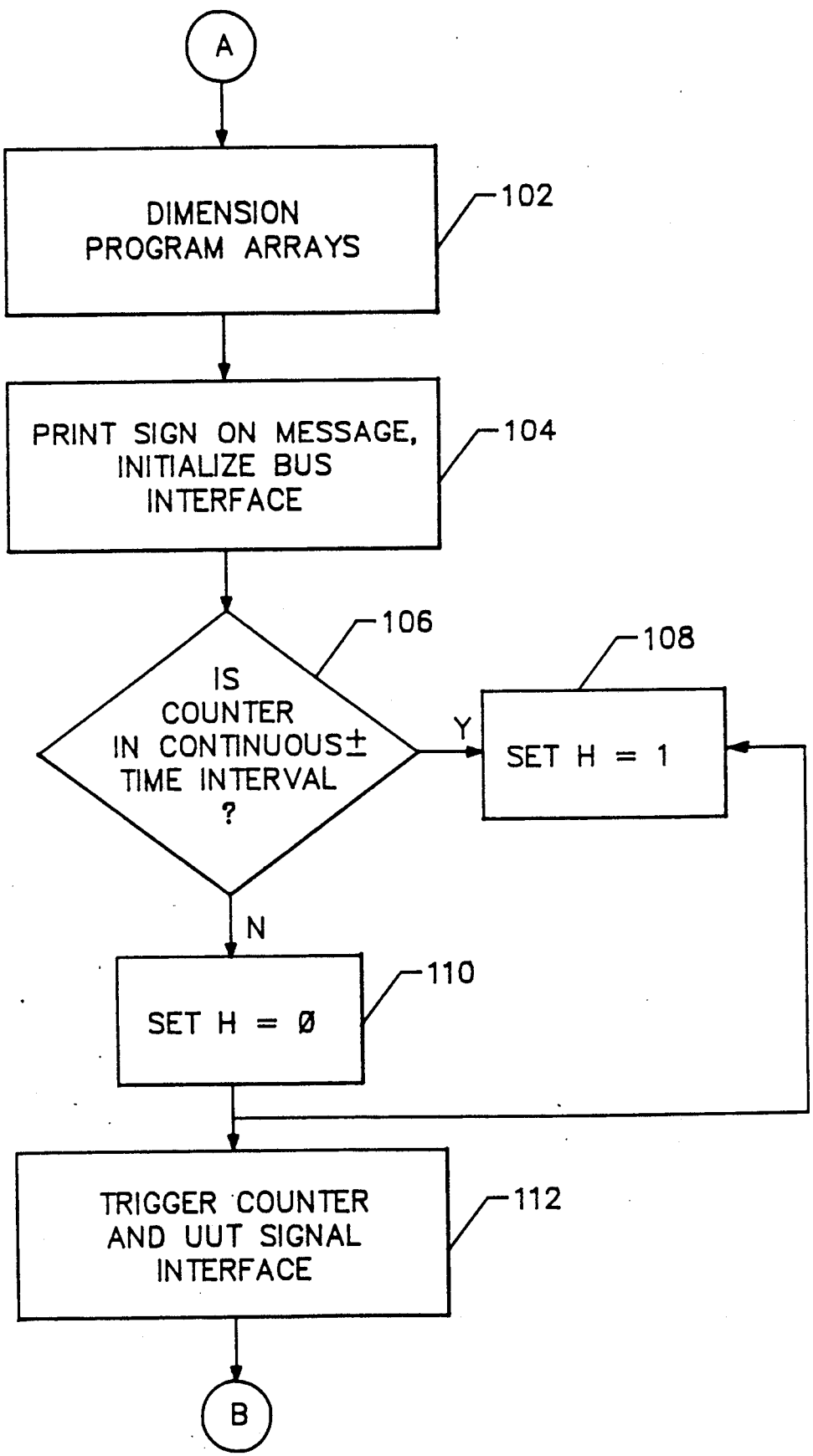
FIG. 2a is a partial representation of the signal conditioning step and means (10) functional flow diagram and continuous time counter step and means (20), functional flow diagram, in computer program logic format.

The continuous time counter step and means 20 provides the vehicle for acquiring the unit under test 1 signal data. FIG. 2a describes the initialization of the counter 20 and the subsequent triggering of both the counter 20 and unit under test 1. The counter reads the continuous time interval data from the test signal and stores it internally in tabular form. The external computer then down loads the data for further processing.

FIGS. 2b to 2g are functional flow diagrams, in computer program logic format, for data conditioning and reformatting step and means 30 for the apparatus form of the invention. The objective of the data conditioning step, represented by FIGS. 2b to 2g, is to convert measurement data to a floating point format for future use by the calculation routines. Before the step is executed, the human operator of the invention must indicate to the invention whether unit under test 1 output signal is a C.W. or a swept signal. The data output signal format from the counter 20 must be binary. The number of measurements to be taken must be a group of at least 6 but no more than 300.

The step, referring to FIG. 2a, is initialized by dimensioning program arrays as shown by Block 102 and a sign-on message is displayed to the operator and the interface bus between unit under test 1 and the invention is initialized by Block 104. Block 106 determines if the continuous counter is in the mode to collect full cycle time interval data or half cycle time interval data. If the counter is in the half cycle collection mode then the "H" flag is set to 0 in Block 110; otherwise, the counter is in the half cycle collection mode and the "H" flag is set to 1 in Block 108.

Next as shown in FIG. 2a, previous measurement data is cleared from counter memory and a new table of readings is taken by Block 112. This is done by issuing "TRIG (10)" and "INIT (1)" commands. The counter is then placed in the REMOTE mode by the issuance of the "REMOTE (10)" command.

Figure 2B:
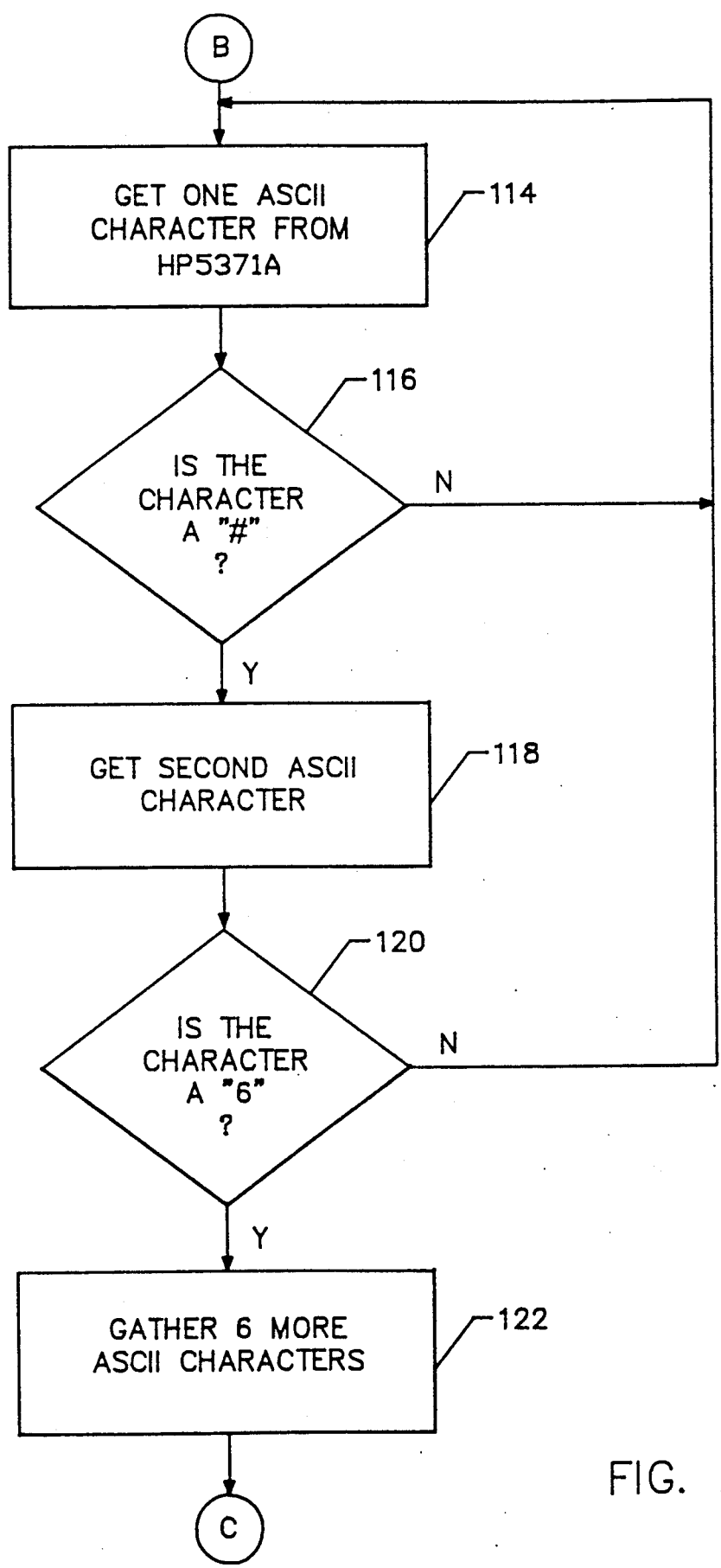
FIGS. 2b to 2g are functional flow diagrams, in computer program logic format, for the data conditioning and reformatting step and means (30).

Unit under test 1 output signal measurement data is then down-loaded to the controlling computer by bringing the data in from the counter one ASCII character at a time until a "#" followed by a "6" is detected, as shown in FIG. 2b. This is represented by Blocks 114–120. The computer program is now synchronized with the new signal measurement data and can complete the data transfer from counter 20 to the host computer over the interface bus. The next 6 characters are evaluated to determine the total number of data characters to be transferred from the unit under test, as shown by Block 122.

Figure 2C:
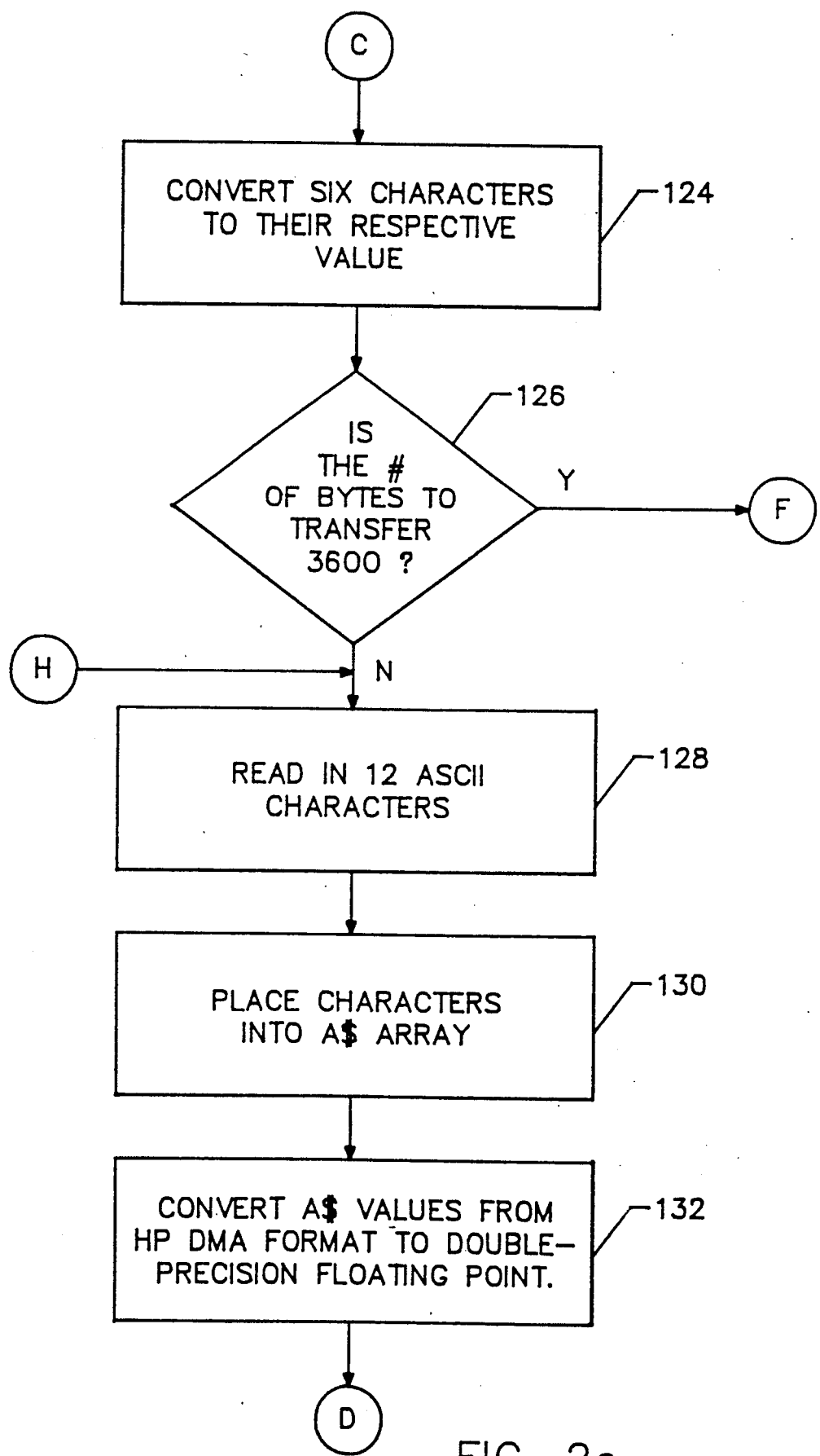
Figure 2D:
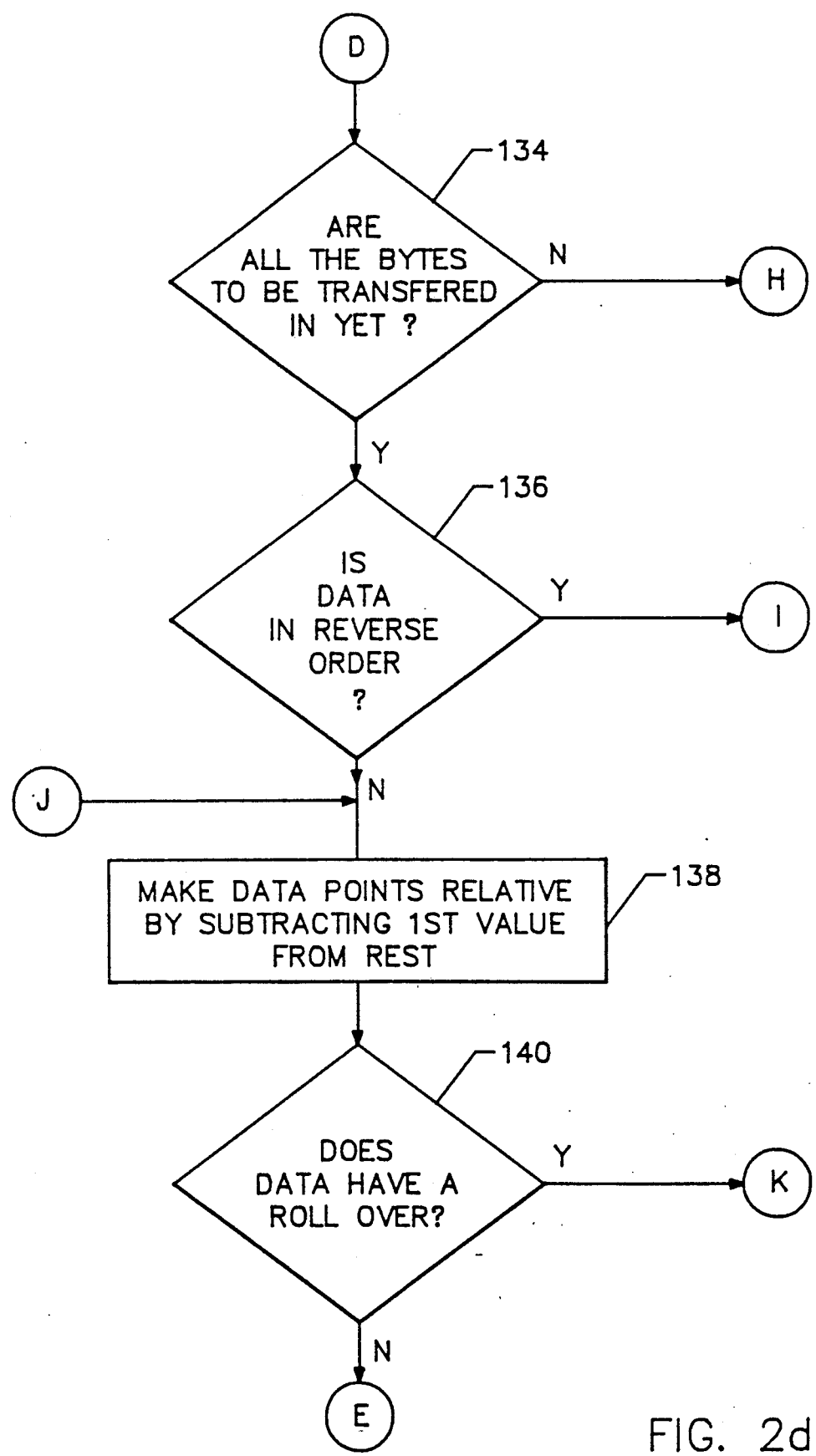
Figure 2E:
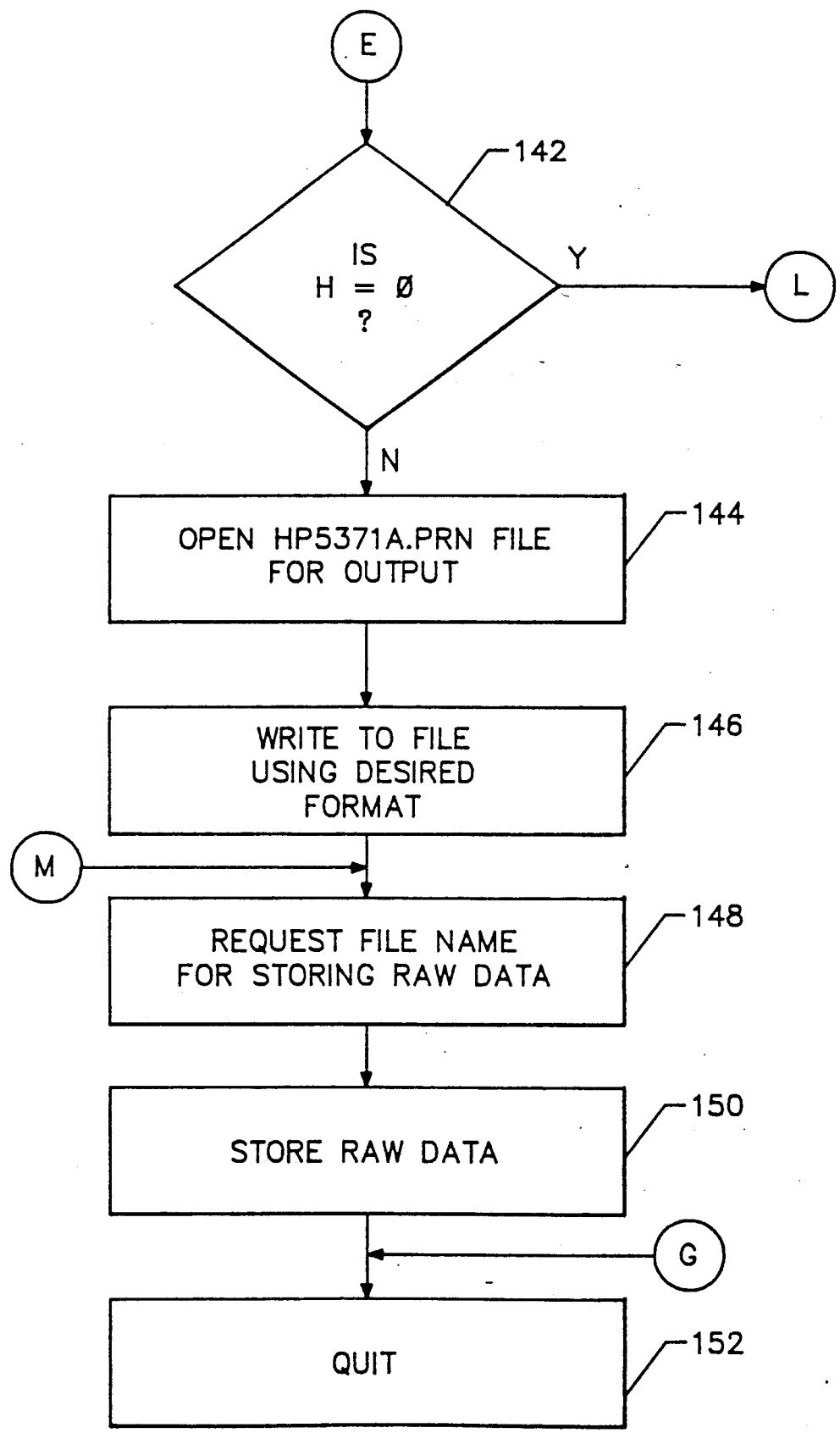
Figure 2F:
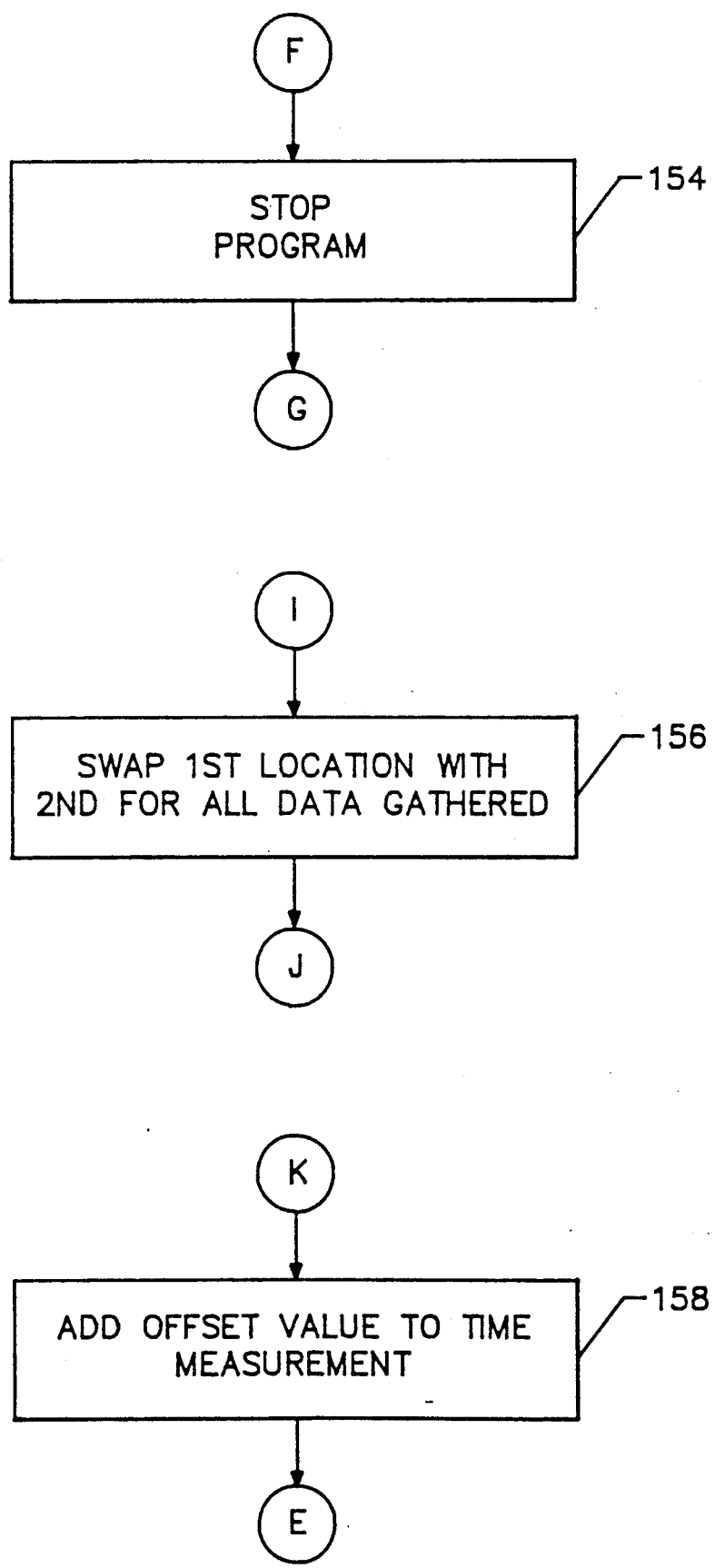
Figure 2G:
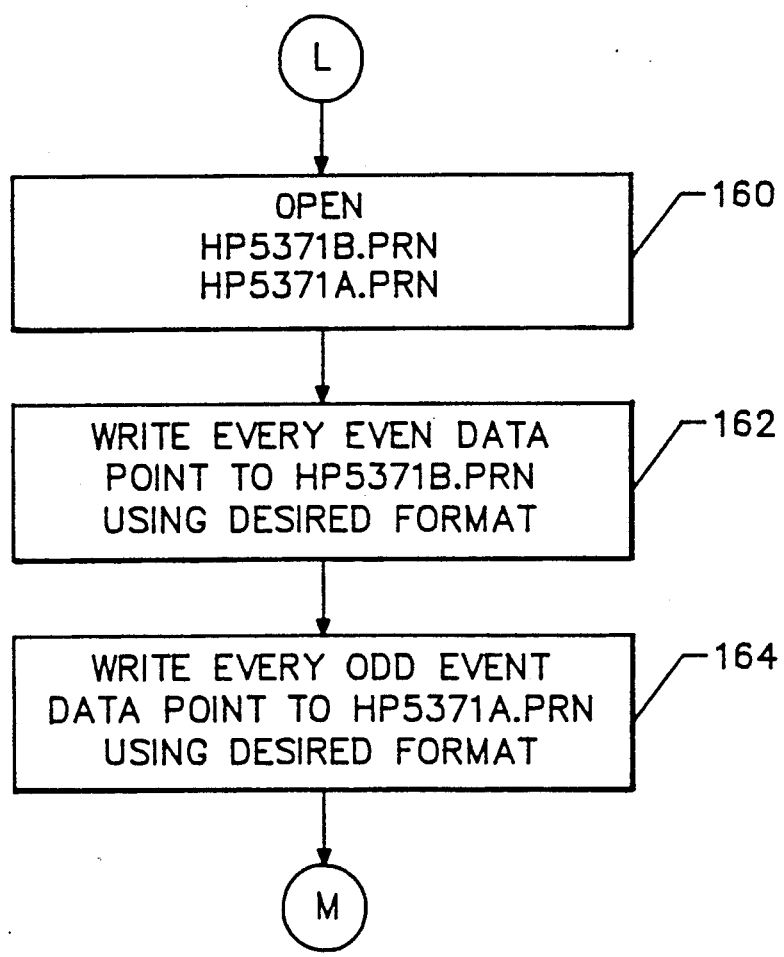

As shown in FIG. 2c, Blocks 124-132, and FIG. 2f, Block 154, the next data characters are transferred one at a time until twelve bytes have been received. This block of twelve characters is then evaluated. These twelve bytes define two time marks of the measured waveform zero crossings (one cycle). The difference between the time marks defines one unit under test 1 signal time interval. The diagram below numbers the characters (or binary bytes) for ease of reference.

|  | Binary Bytes | | | | |
| --- | --- | --- | --- | --- | --- |
|  | MSB | | | LSB | |
| time mark 1: | 1 | 2 | 3 | 4 | 5 | 6 |
| time mark 2: | 7 | 8 | 9 | 10 | 11 | 12 |

Byte 1 is the most significant bit (MSB) of timemark 1, while byte 4 is the least significant bit (LSB).

Byte 7 is the MSB of time mark 2, while byte 10 is the LSB. The four bytes comprise a 32 bit binary number. Additional resolution is provided within bytes 5 and 11 and provide the operator with 200 picosecond resolution. Bytes 6 and 12 are designated for future growth. The following explanation references time mark 1; the procedure is also applicable to time mark 2.

Each binary count within bytes 1 through 4 represents a 2 nanosecond increment of time. Byte 5 is two times the number of 200 picosecond increments required to be added to the 32 bit value whose MSB is byte 1. Therefore, it is necessary to reduce the magnitude of the value of byte 5 by $\frac{1}{2}$. To accomplish this, the multiplying factor is reduced by $\frac{1}{2}$.

That is, instead of multiplying byte 5 by 200 nanosecond, multiply by 100 nanoseconds. Therefore, the equation for evaluating the first measurement value is:

Tm1 = (((byte 1*256 + byte 2)*256 + byte 3)*256 + byte 4)*2 nanoseconds + (byte 5 ANDED $31_{10}$)*100 picoseconds The second measurement value is evaluated similarly. Byte 1 becomes byte 7, etc. and byte 5 becomes byte 12. This arithmetic operation is carried out in double-precision to retain the necessary significant digits. Each group of twelve bytes brought in is similarly evaluated until all time measurement values are in memory. The counter is then returned to LOCAL.

FIG. 2d and FIG. 2f (Blocks 156 and 158) supply the logic for the computer program in the event that pairs of measurements, relating to unit under test 1 signal, can be entered into the computer's memory in either of two orders. Normal order is defined as an ascending order with pairs of numbers such that the smallest time value is always first. Reverse order is defined such that the larger time value of the two comes first. The measurement values are examined for reverse order and, if such order is present, changed to normal order (Block 136). Another occurrence that requires sensing and alteration is the rollover of the 32-bit counter while counting time. A rollover occurs when the 32-bit counter register overflows and is reset back to zero. Rollovers occur once every eight seconds. It is assumed that in any group of three pairs of signal measurements, there can be only one rollover. A rollover in a pair of measurements appears like a reverse order condition. To distinguish an actual reverse order from a rollover, a "majority rules" approach is used. For reference, the measurement values will be referred to as value 1, 2, 3, ... starting with the first. If value 2 minus value 1 is greater than zero, than a value of +1 is added to a weighting function. If the subtraction is less than zero, then a −1 is added to the weighting function. Value 4 and value 3 are likewise compared; values 6 and 5 are likewise compared. The weighting function, which is a straight summation is then evaluated to determine order. If the summation is greater than zero, then the order is normal; if the summation is less than zero, then the order is reverse. Values in reverse order are swapped 1 for 2, 3 for 4, ... to establish normal order. This swap technique is requested by Block 156 of FIG. 2f.

In Block 138 (of FIG. 2d), the list of values is now referenced to zero time by subtracting the first value from all values in the list. In Block 140, a test for rollover is performed. Each value in turn is compared to zero: if the value is positive, no rollover exists; if any value is negative, a rollover has occurred and $2^{32} \times 2 \times 10^{-9}$ nanoseconds is added to the negative value and all subsequent values, as represented by Block 158 (FIG. 2f).

Referring to FIG. 2e, as shown by Blocks 142-152, if the "H" flag was set to 1 in Block 108 (H=1), then counter 20 measured full cycle intervals. The measured time interval values are converted to floating point numbers and multiplied by 1000 to place the data in units of milliseconds. This data is written into a file, as represented by Block 144, using a format allowing 10 significant digits to the right of the decimal point.

If the "H" flag was set to 0 in Block 110 (H=0), then counter 20 measured half cycle intervals. The half cycle data is then split into two tables of full cycle data, as shown in Blocks 160-164 of FIG. 2g. Counter 20 acquires samples every half period, which are interleaved; in this case, every other value, starting from the first, is written into a particular file; every other value, starting from the second is written into another particular file. A format allowing 10 significant digits to the right of the decimal point is used. Block 146 of FIG. 2e represents the writing to the file.

The program then requests the name of a file in which to store all the values as they exist in memory, as shown by Block 148. Once such a file name is entered and confirmed, the "raw" data values are written into the file, as represented by Block 150.

This step of the process of the invention terminates, as represented by Block 152.

(c) Calculation of Prescribed Parameters;

(d) Alignment of Parameters with Quantities;

(e) Computation of Incremental Signal Frequencies; and (f) Subtraction of Signal Frequencies FIGS. 3a to 3i are a functional flow diagram, in computer program logic format, for calculating prescribed parameters steps and means 40, relating to the signal output from unit under test 1; aligning the calculated prescribed parameters with the prescribed quantities step and means 50; computing incremental signal frequencies from the incremental cycle periods as measured step and means 60; and subtracting the incremental signal frequencies from the predicted signal frequencies to form a residual quantity step and means 70, for the apparatus form of the invention. FIGS. 3a to 3i particularly describe the signal flow of the steps of the process form of the invention. The objective of the process steps described by FIGS. 3a to 3i is to accomplish the above-described steps of the invention.

Figure 3A:
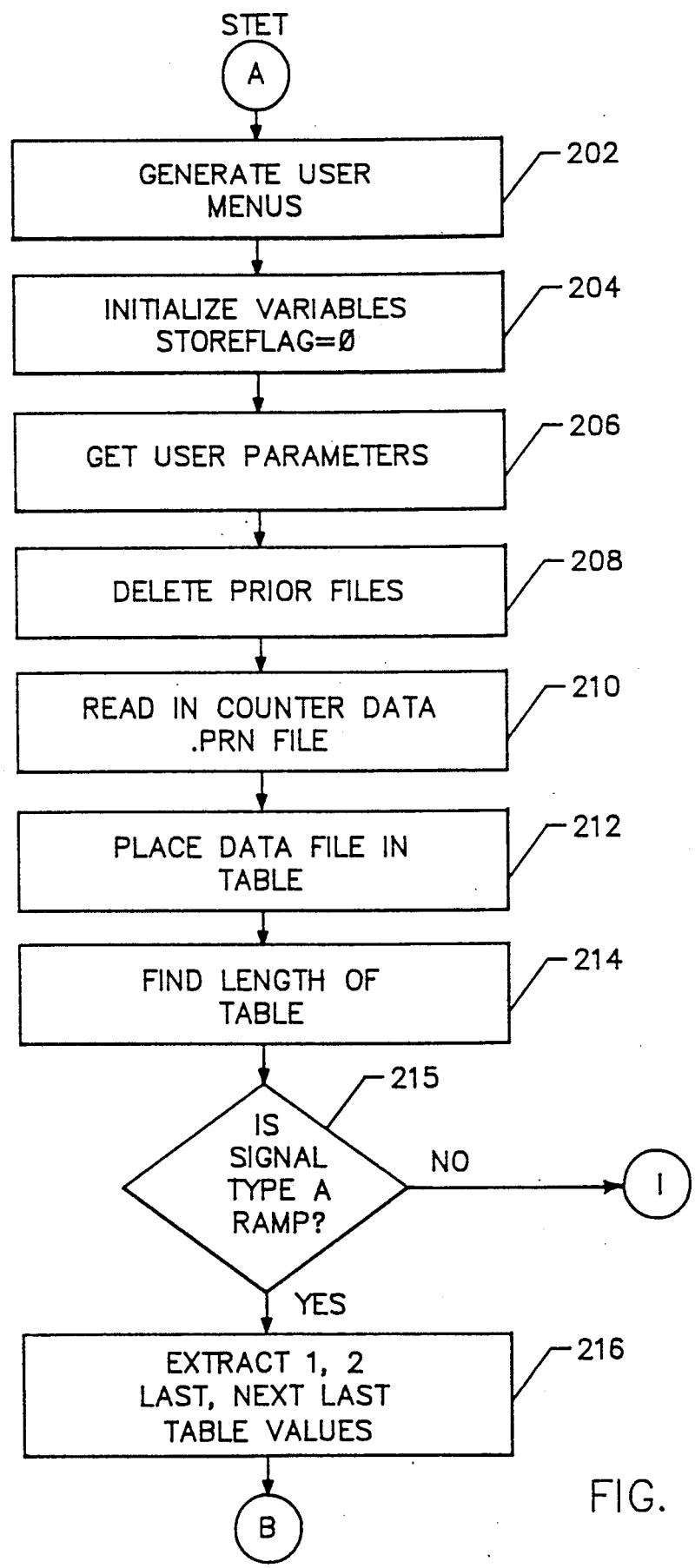
FIGS. 3a to 3i are signal functional flow diagrams, in computer program logic format: for calculating prescribed parameters relating to the signal output from the unit under test step and means (40); for aligning the measured signal data with the calculated ideal with model data step and means (50); for computing incremental signal frequencies from the incremental cycle periods as measured step and means (60); and for subtracting the incremental signal frequencies from the predicted signal frequencies to form a residual quantity step and means (70).
Figure 3B:
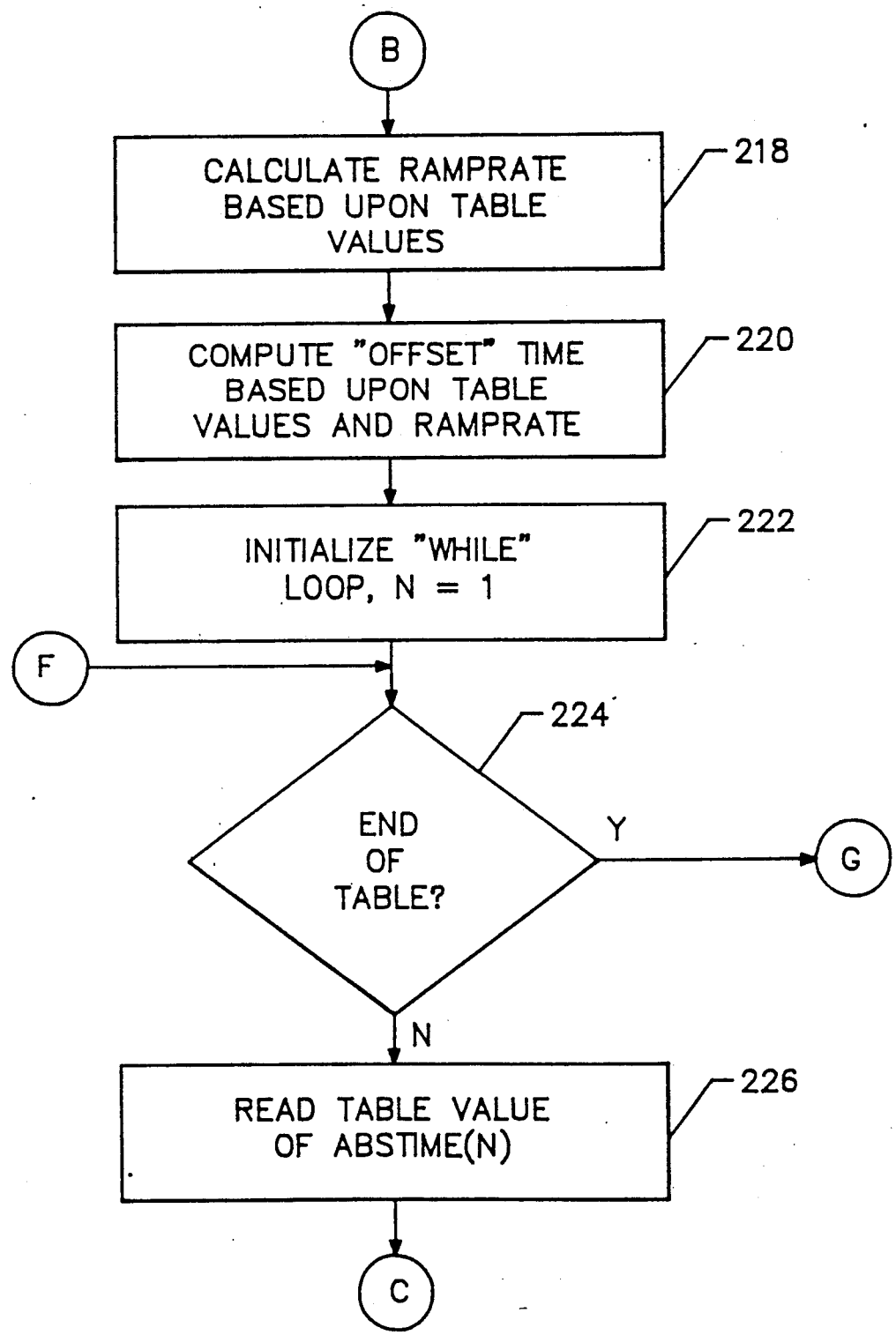

The program starts by generating menus necessary to configure the software, as represented by Block 202 of FIG. 3a; initializing program variables, as represented by Block 204; and obtaining parameters, as represented by Block 206. The program searches for duplicate file names and deletes them if they exist, as represented by Block 208. The program then reads the file that was previously created and designated, and moves the information into a specified table, as shown by Blocks 210 and 212. As represented by Block 214 of FIG. 3a, the length of the table is derived. Block 215 determines (based upon information input to the invention by a human operator) whether the input signal was C.W. or swept. If the signal was C.W., then the ramp rate need not be calculated and the data in the table is normalized to seconds in Block 274 of FIG. 3g. If the signal was swept, then four values are extracted, which are subsequently used in calculating the slope of the ramp output signal of unit under test 1, as represented by Blocks 218 to 226 of FIG. 3b.

Figure 3C:
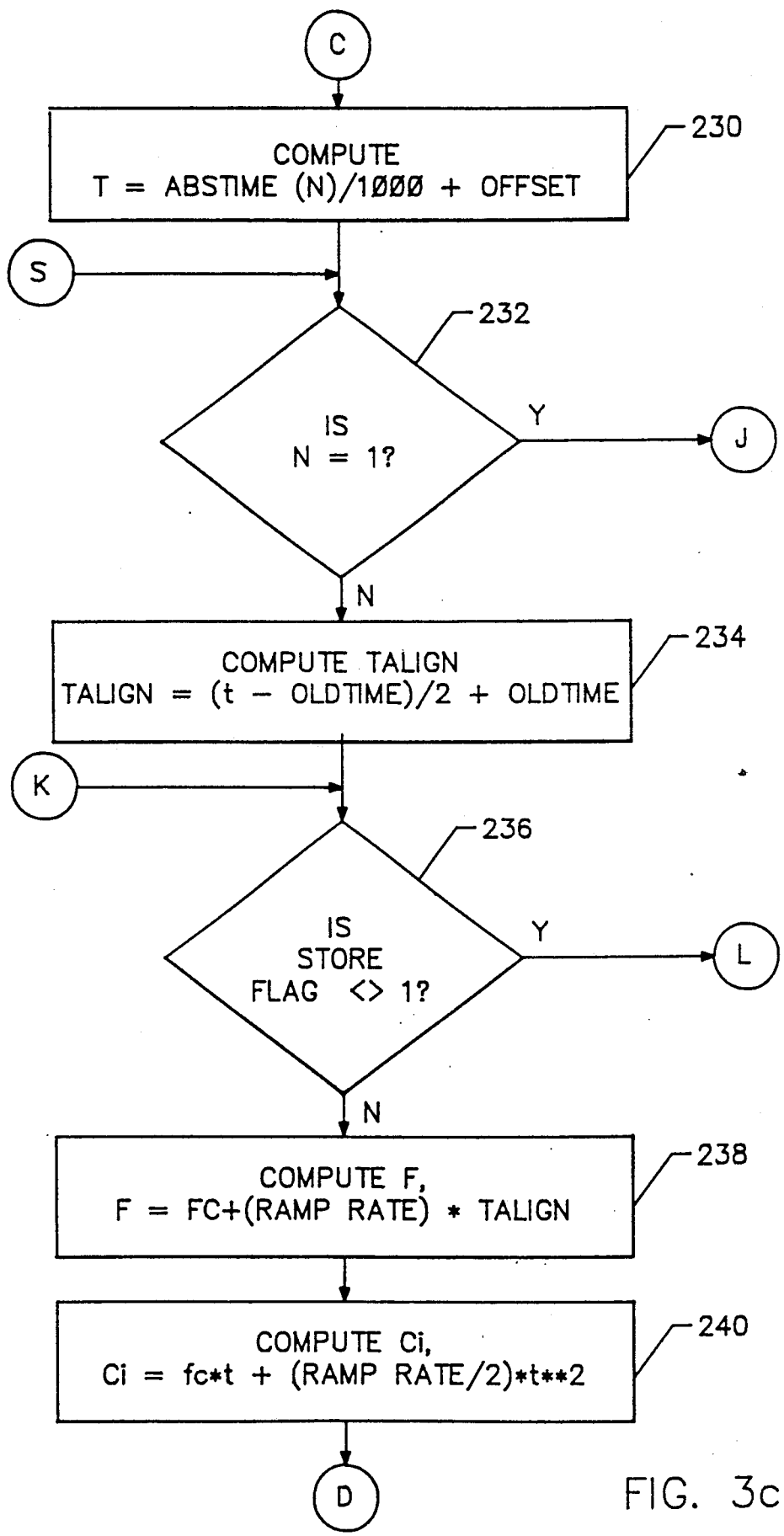
Figure 3D:
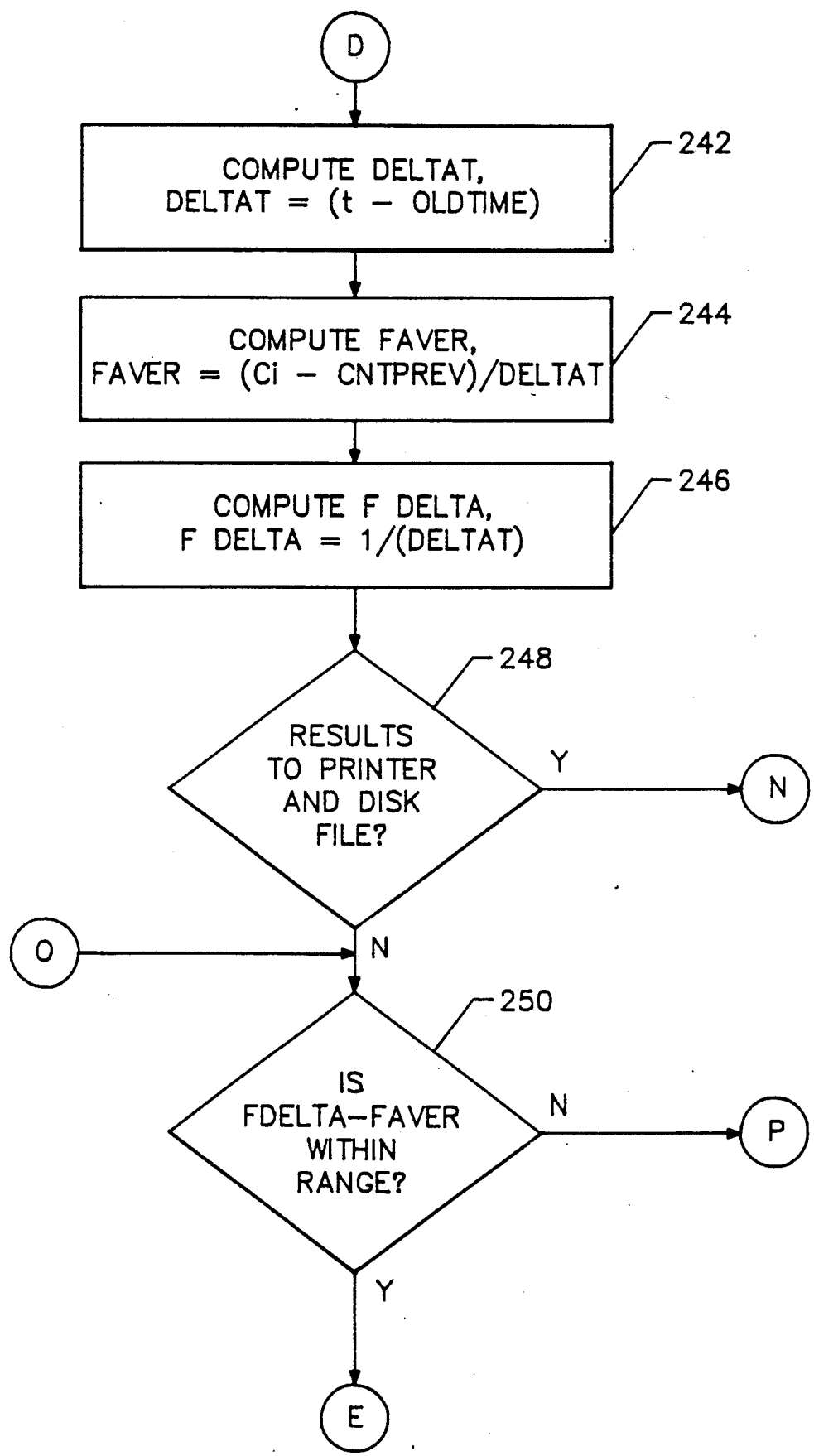
Figure 3E:
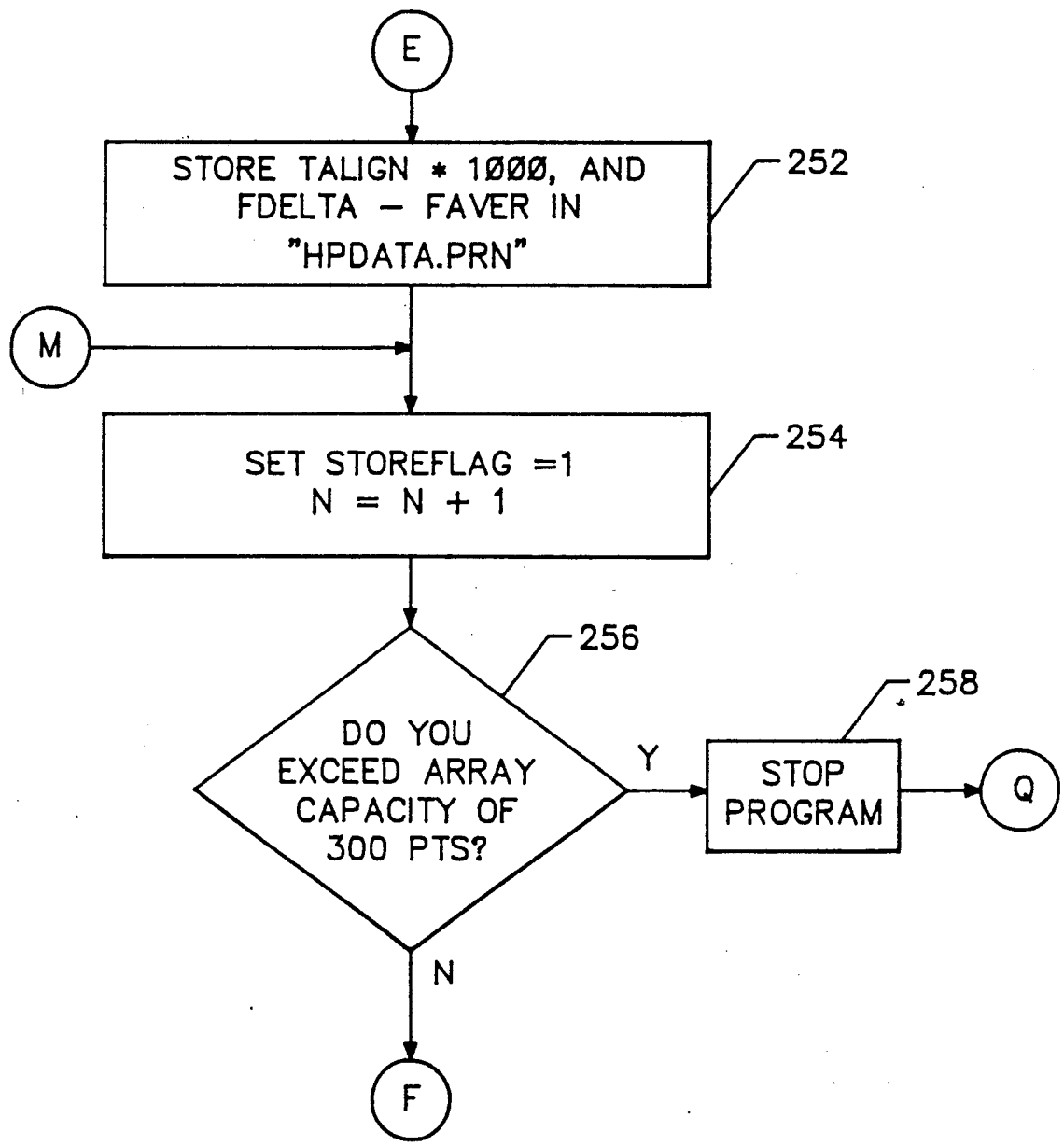
Figure 3F:
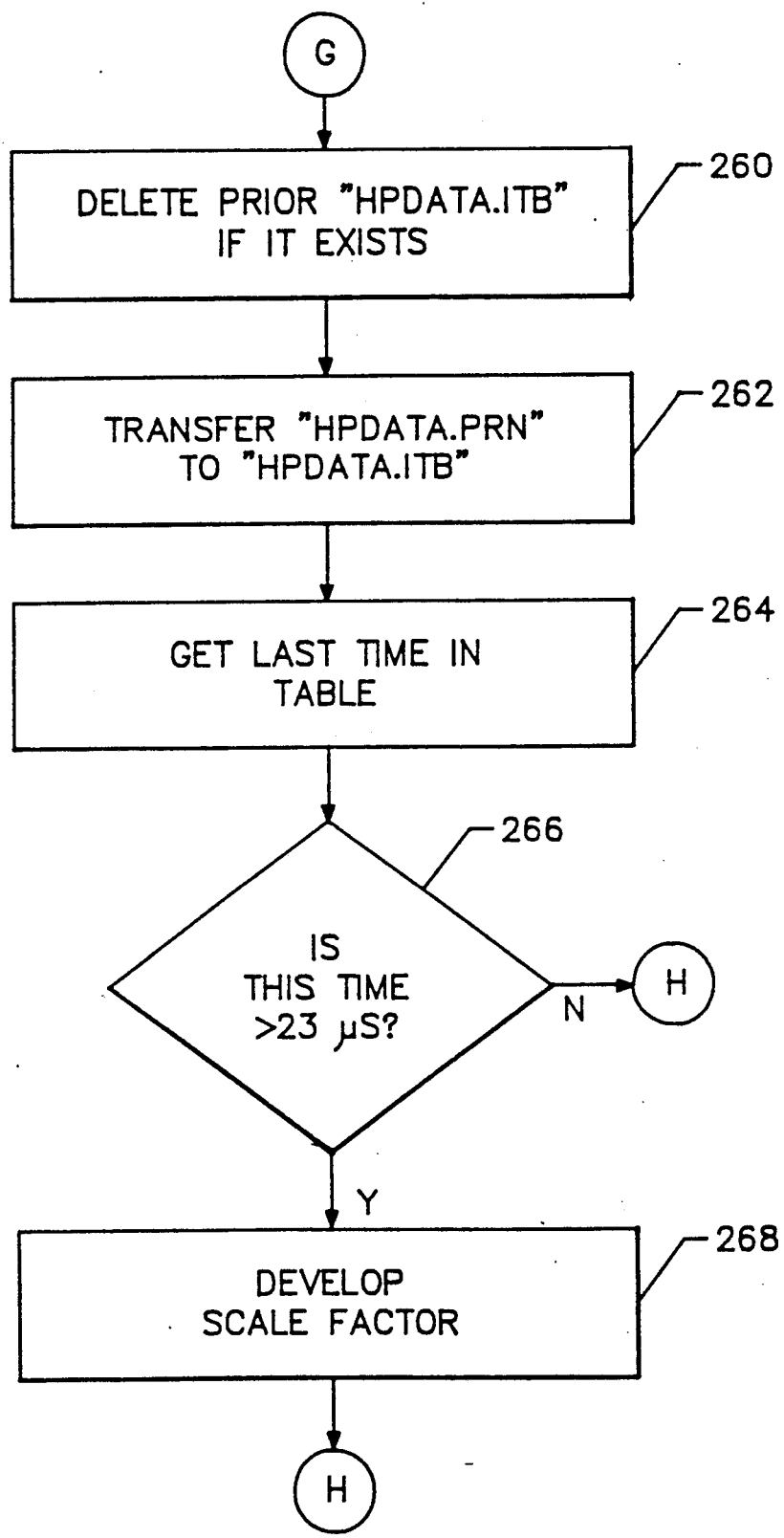
Figure 3G:
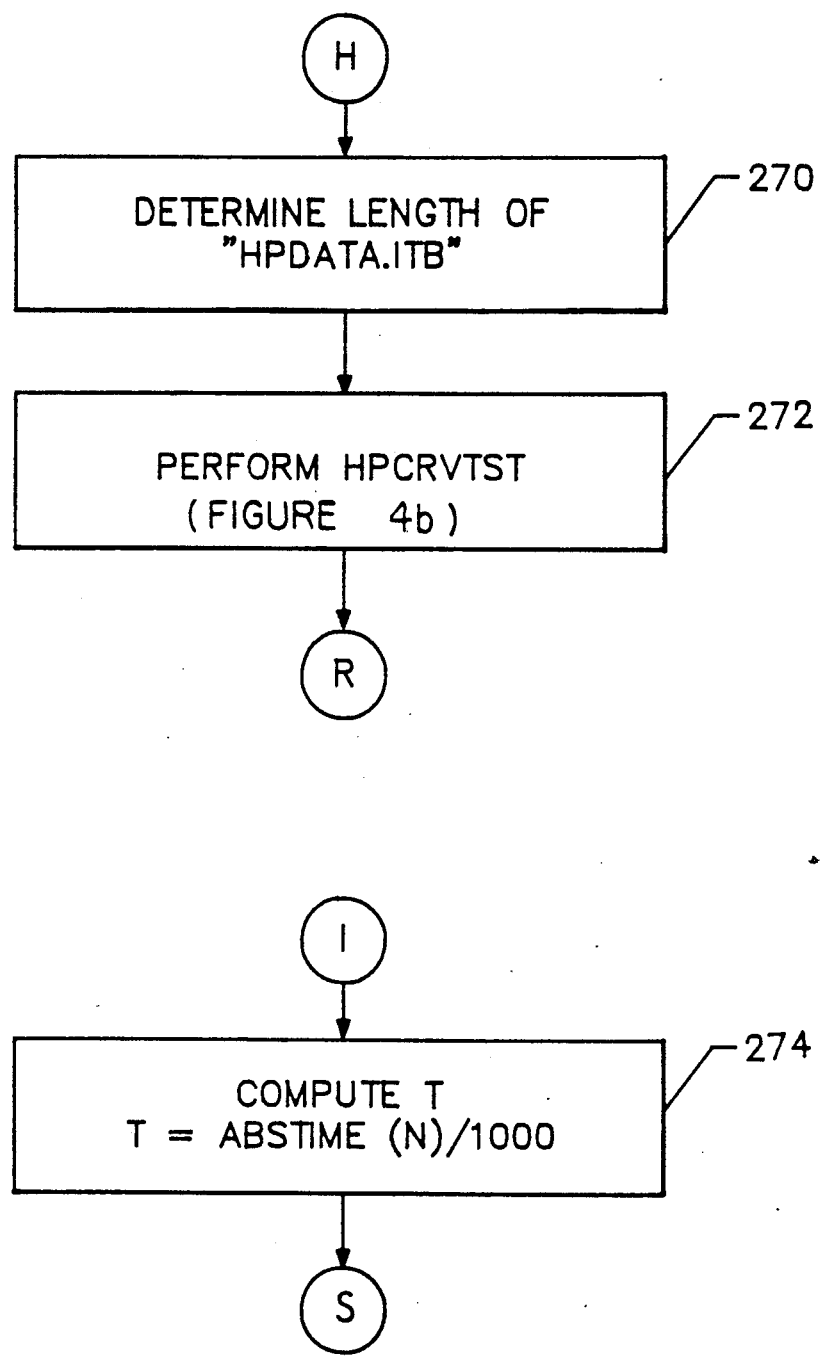
Figure 3H:
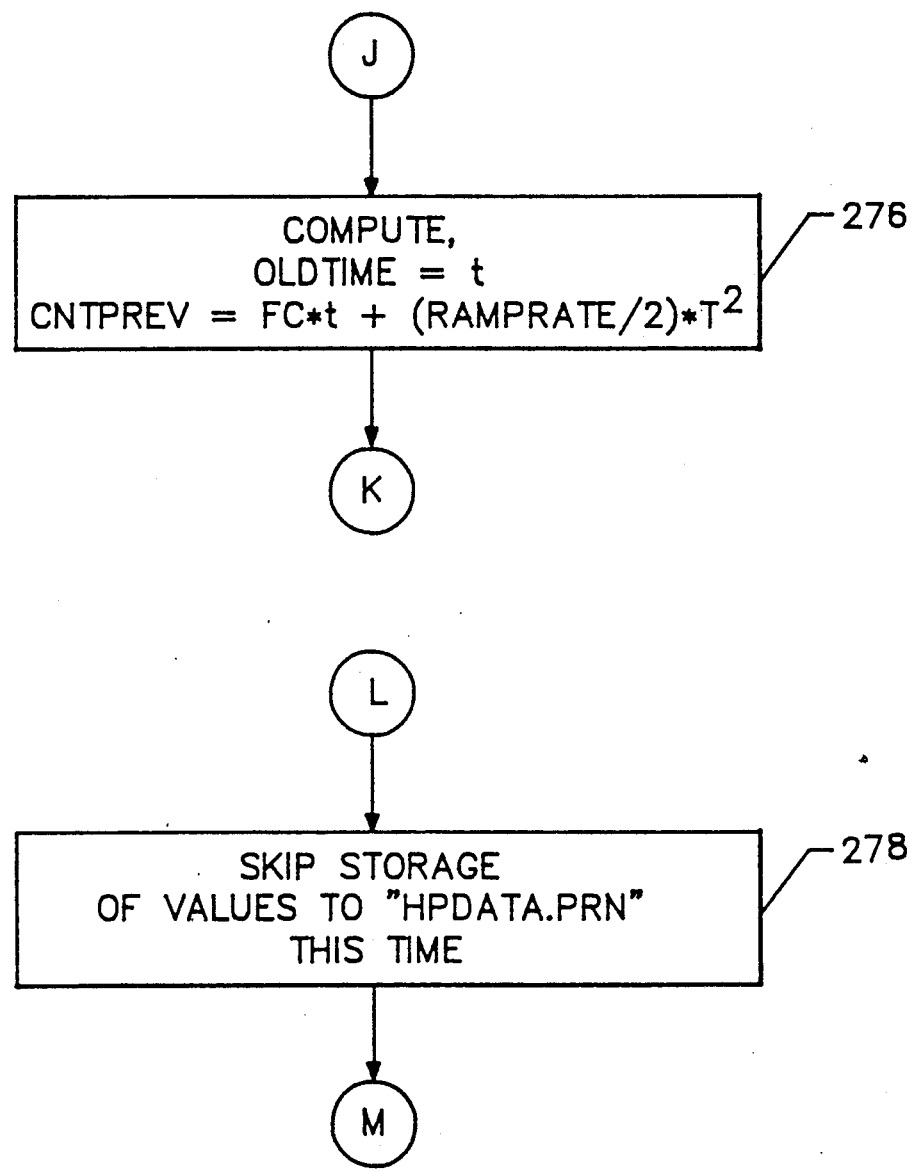
Figure 3I:
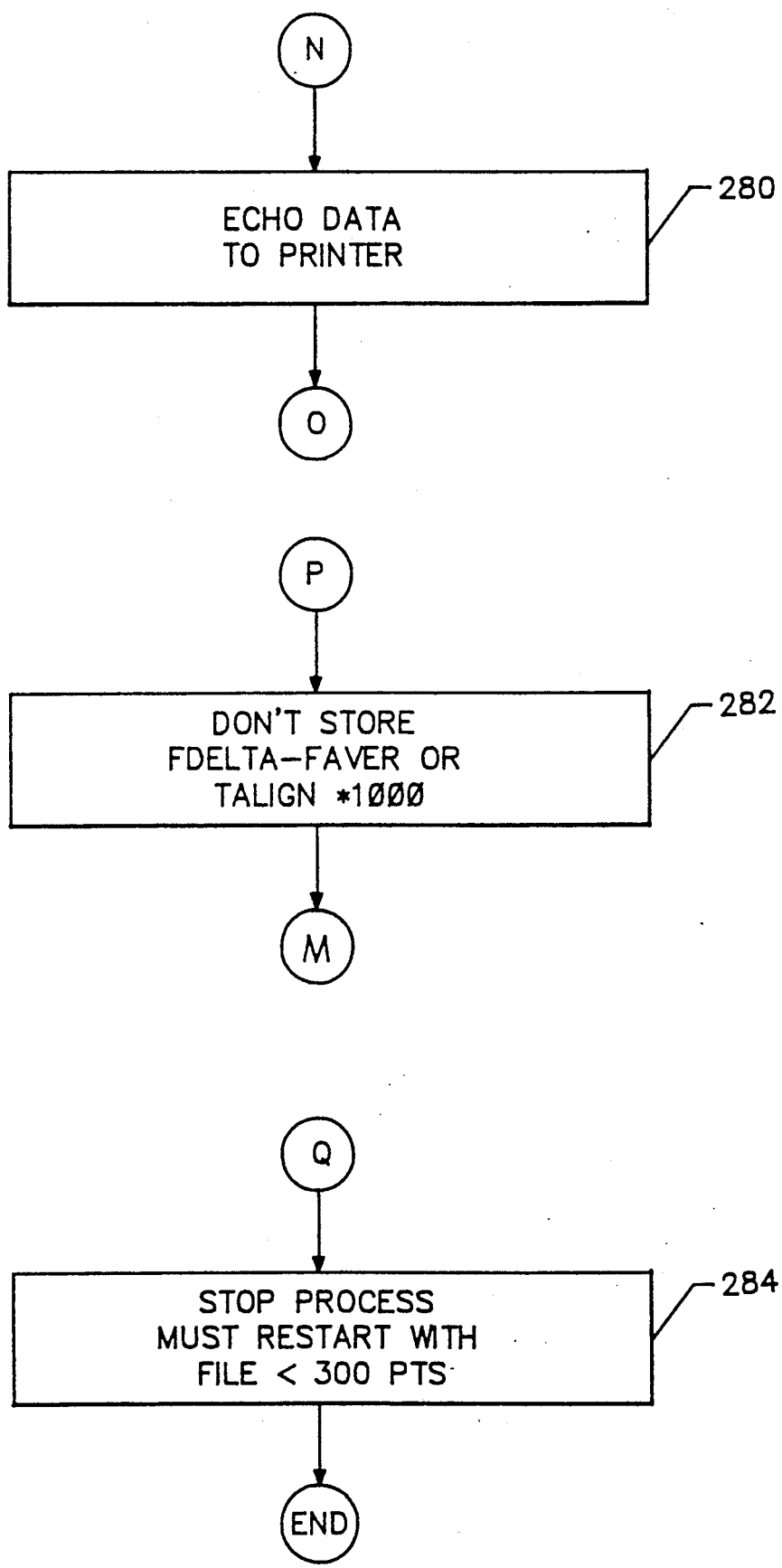

As described in FIG. 3c and 3d, Blocks 230–250, each time mark that is contained within the above-referenced table is extracted and divided by 1000 (to convert from milliseconds to seconds), and an offset time is added to time-correlate the ideal model quantities with the measured date quantities, as represented by Block 230. Next, as shown by Block 232, a test is performed to see whether this is the first time through the program loop. If it is, computing and storing the alignment quantity, "TALIGN", does not occur, because at this point, the two time arguments (previous and present time) necessary for calculating "TALIGN" are not present. If unit under test 1 signal is offset by a carrier signal, the carrier frequency FC is included in the absolute frequency calculation, as indicated in Block 238. Then the ideal cycle equation, which determines the number of cycles per unit time, Ci, is evaluated at the previous and present value of time, as shown in Block 240. This produces two values for the number of cycles occurring during this period (Ci and "CNTPREV").

The following sequence of computations are done by the program as represented by Blocks 242 to 250 of FIG. 3d. "DELTAT", the difference between the previous and present time interval is calculated, as represented by Block 242. "FAVER" (the ideal value calculated from the model) is computed in Block 244 by subtracting Ci minus "CNTPREV" (which is the previously stored Ci value), and dividing the result by "DELTAT". In Block 246, the average frequency of the measured signal is computed. "FDELTA" is computed by taking the reciprocal of "DELTAT". This represents the average frequency computed using the measured data. Then, "FDELTA-FAVER" is computed to find the difference between the prediction model, "FAVER" and the measured value "FDELTA", in Block 250. The time intervals and the frequency difference are then stored in a specific file ("HPDATA.PRN"), as represented in Block 252 of FIG. 3e. This file is created for the purpose of reporting the data into a spread sheet file "AUTOHP.WK1," such as that commercially available by LOTUS, and for creating the table "HPDATA.ITB"; "HPDATA.ITB" table is used by "HPCRVTST" when performing the least square regression. If any of the values contained within "HPDATA.ITB" are found to be too large to be handled by the double-precision operations required by "HPCRVTST," a scale factor is then developed, applied, and passed to the other routines, which is described by Block 250 of FIG. 3d, Blocks 254 to 258 of FIG. 3e, Blocks 260 to 268 of FIG. 3f, Blocks 270 to 272 of FIG. 3g, and Blocks 280 to 284 of FIG. 3i.

(g) Curve Construction

FIGS. 4a and 4b, FIGS. 5a and 5b, and FIG. 6 are functional flow diagrams, in computer program logic format, for constructing a curve step and means 80, using the incremental signal frequencies. These figures particularly describe the signal flow of the steps of the process form of the invention. The objective of the process steps described by FIGS. 4a and 4b, FIGS. 5a and 5b, and FIG. 6 is to accomplish the above described steps of the invention.

Figure 4A:
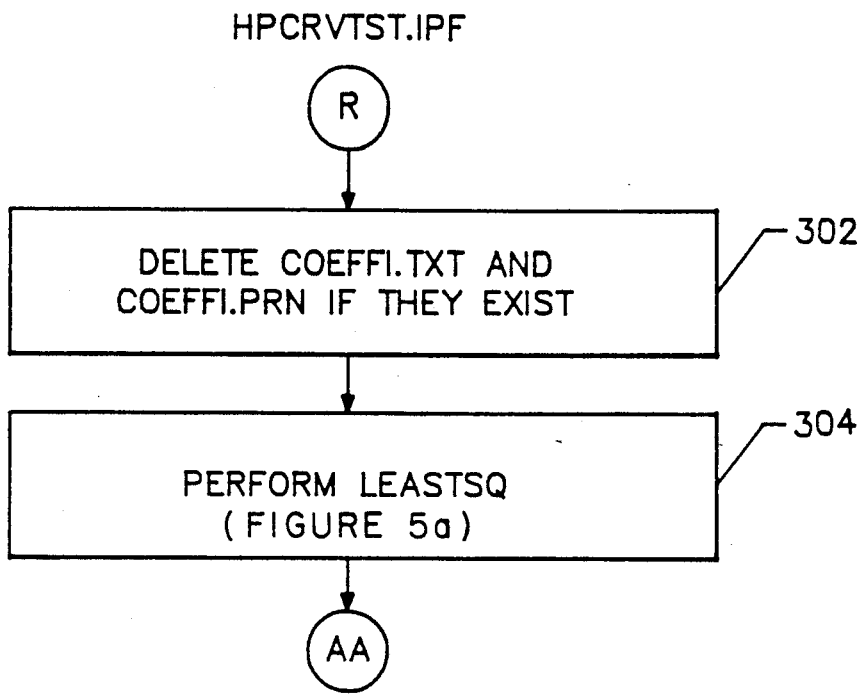
FIGS. 4a and 4b are functional flow diagrams, in computer program logic format, for part of the step and means (80) for constructing a curve.
Figure 4B:
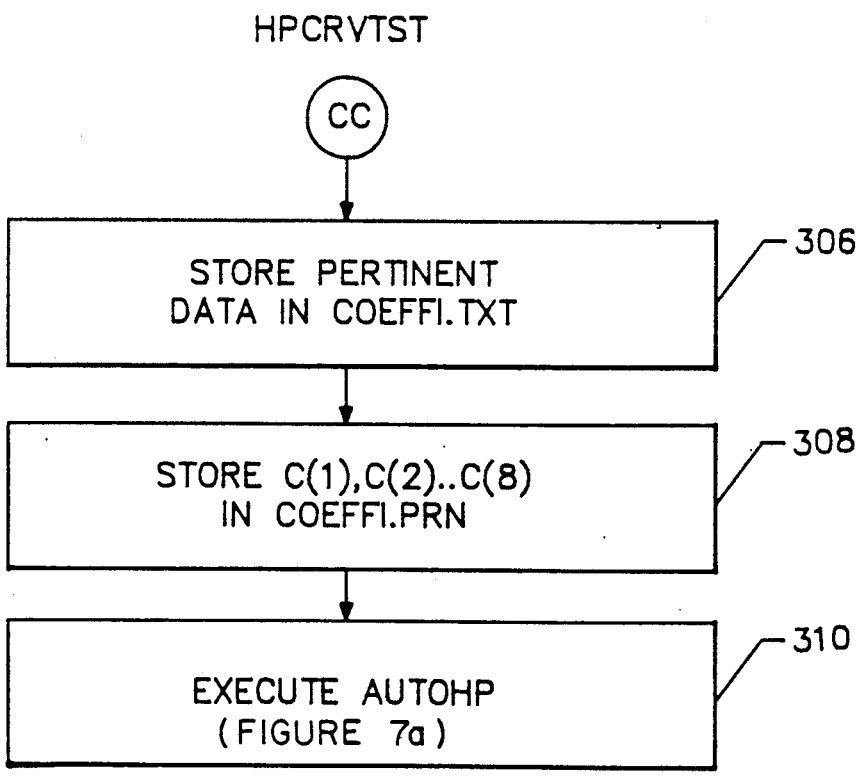

Blocks 302 to 310 of FIGS. 4a and 4b represent the collection of the pertinent information for future calculation and for eventual storage within two particular files ("COEFFI.TXT" and "COEFFI.PRN"). This is accomplished by using the coarse data contained in HPDATA.ITB, and calling the "LEASTSQ" routine module represented by Blocks 402 to 416 of FIGS. 5a and 5b, to create the "COEFFI.PRN" file. The information in the "COEFFI.TXT" file is supplied by the human operator. Both of these tables are used by the program for display step and means 90.

Figure 5A:
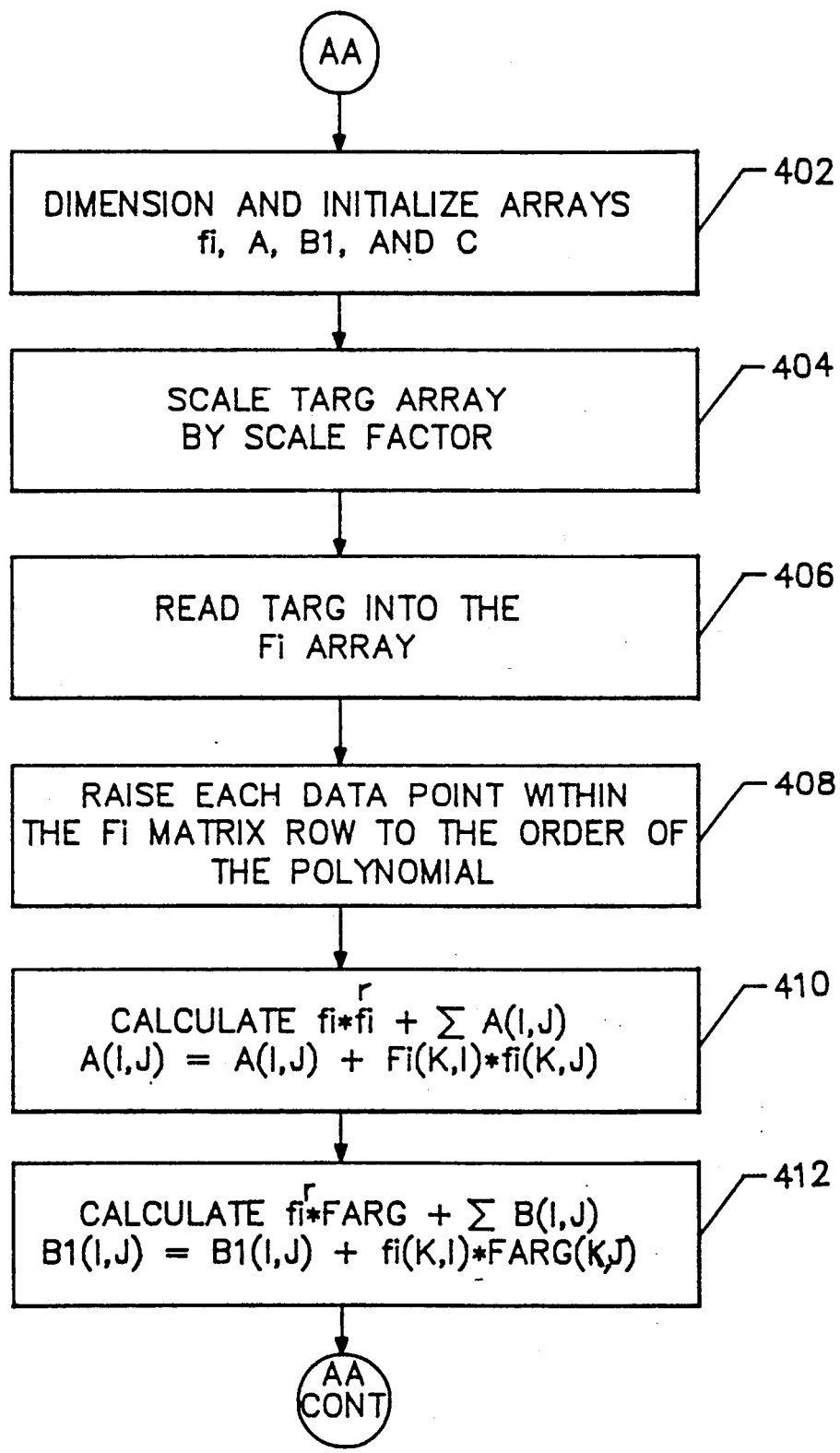
FIGS. 5a and 5b are functional flow diagrams, in computer program logic format, for the least squares algorithm part of the step and means (80) for constructing a curve.
Figure 5B:
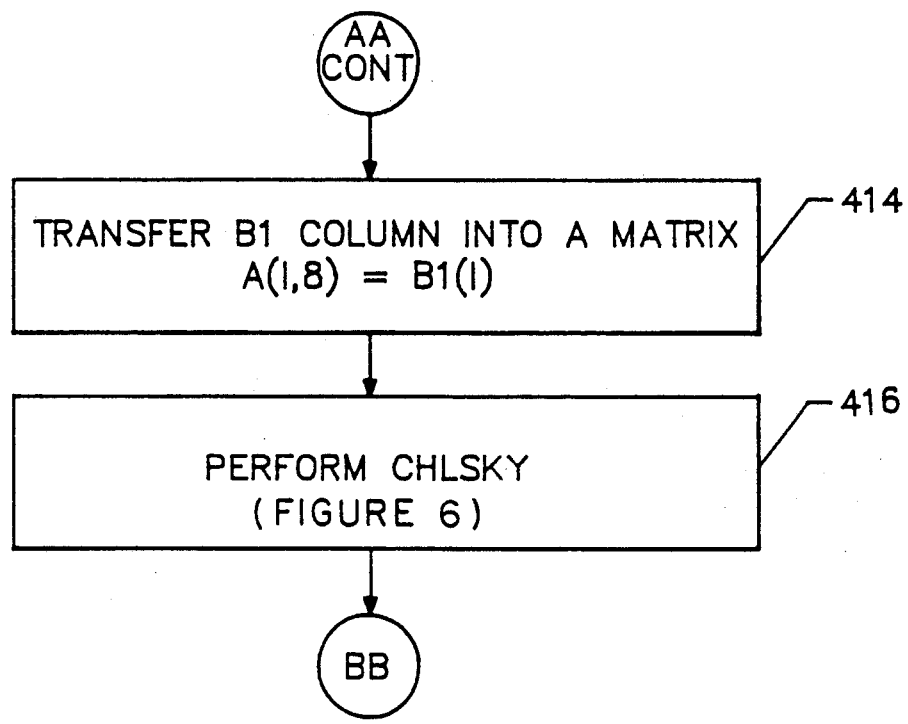
Figure 6:
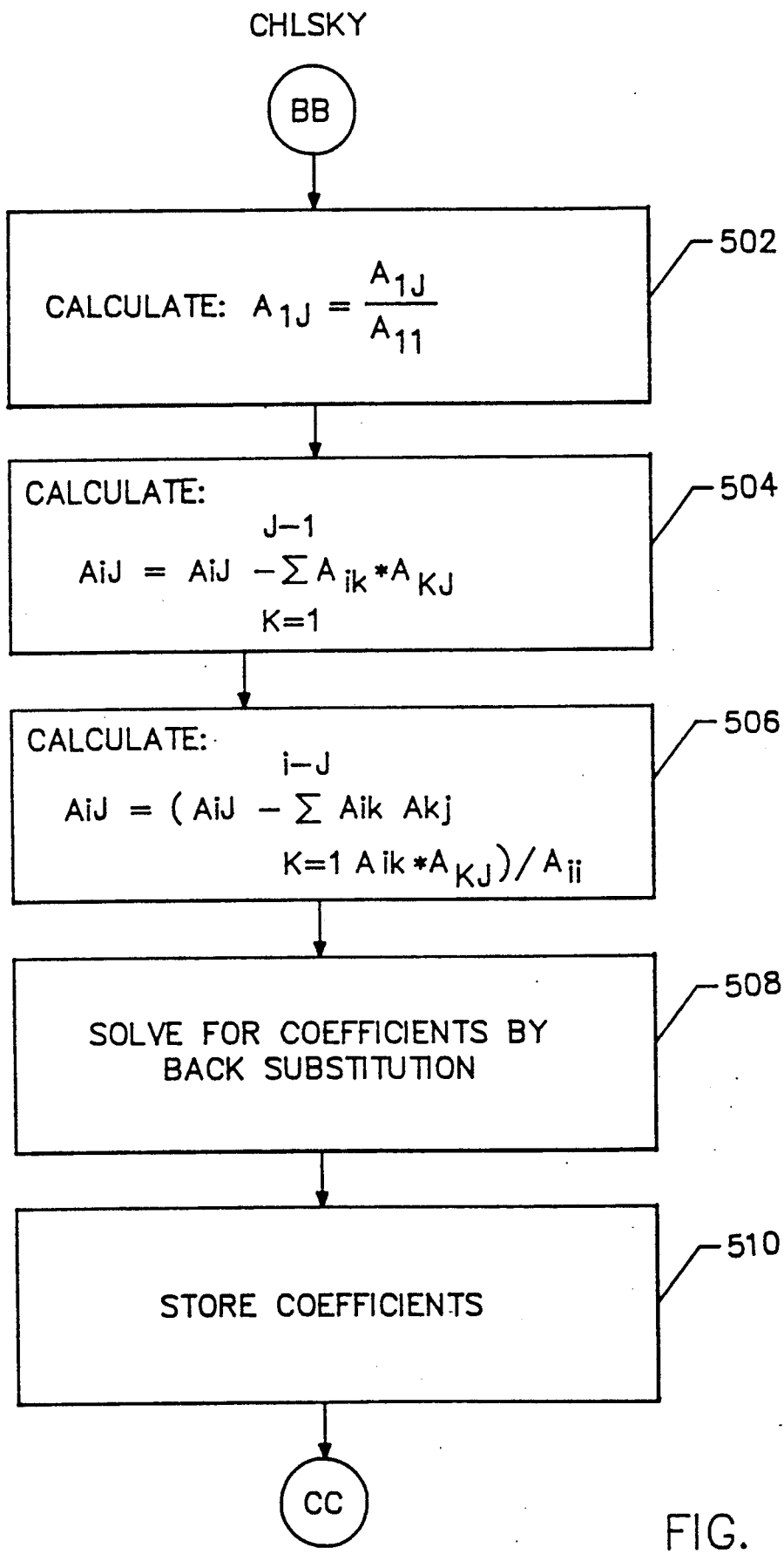
FIG. 6 is a functional flow diagram, in computer program logic format, for the Choelsky method computation, for part of the step and means (80) for constructing a curve.
Figure 7A:
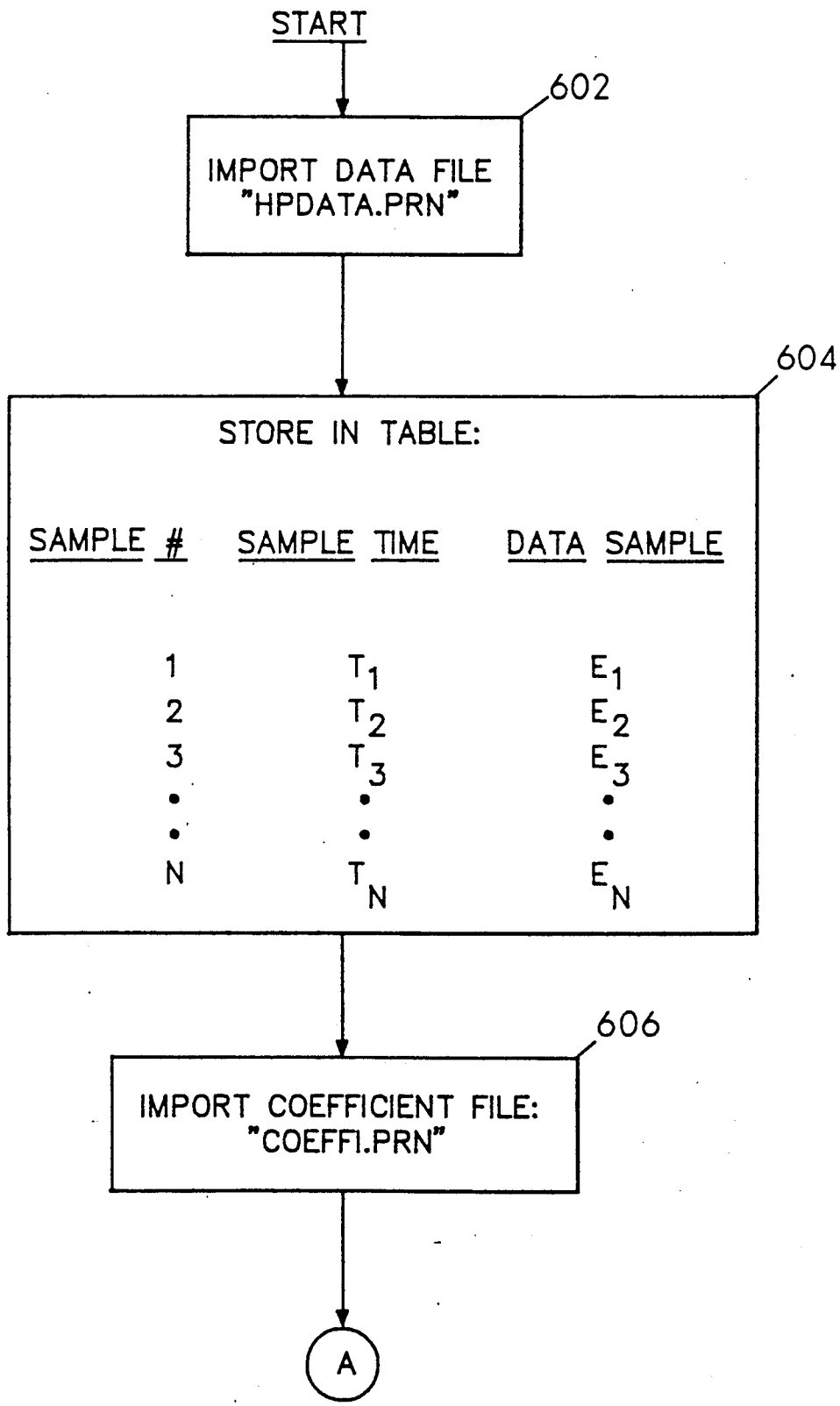
FIGS. 7a to 7h are functional flow diagrams, in computer program logic format, for step and means (90) to display the curve.
Figure 7B:
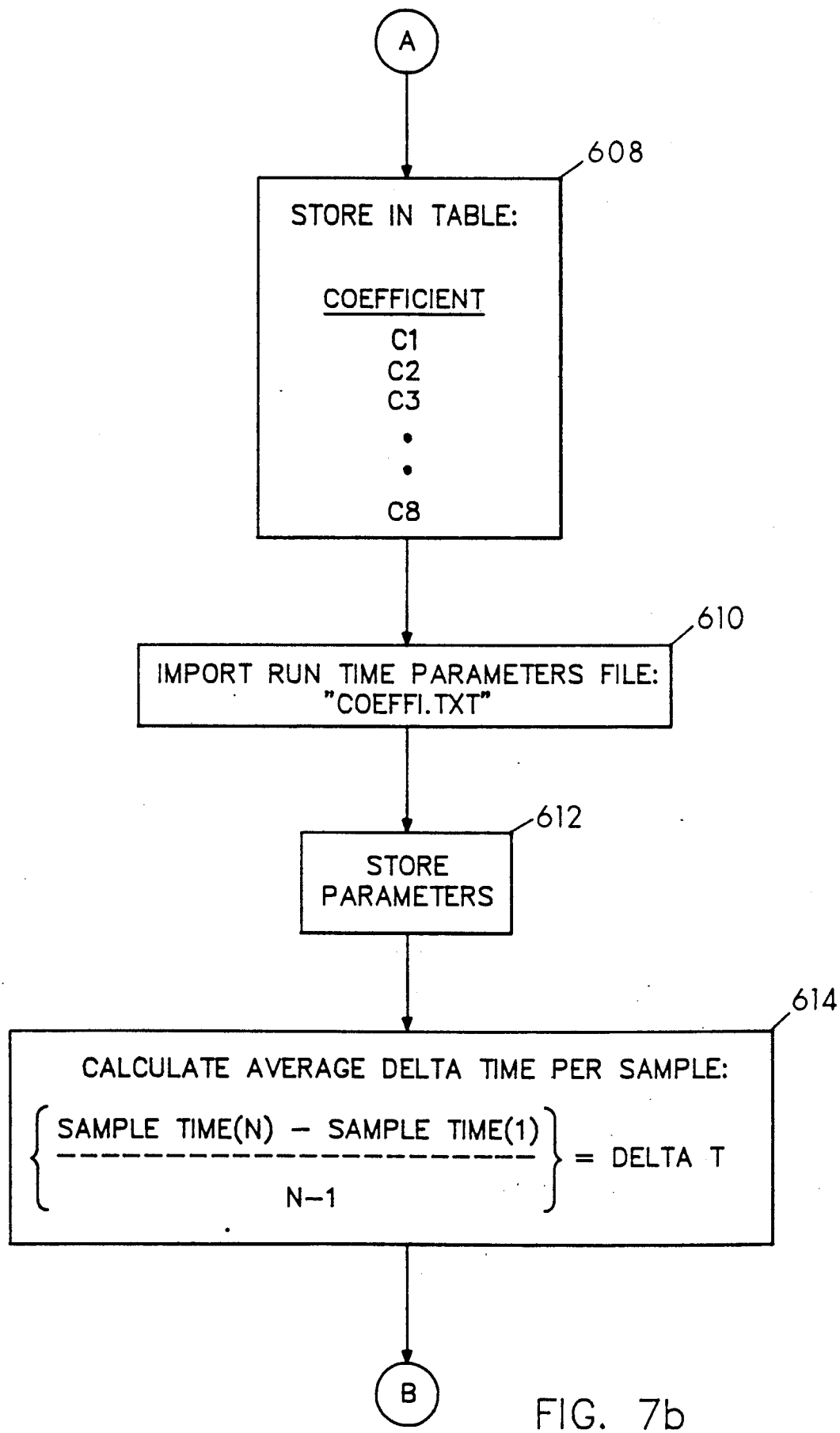
Figure 7C:
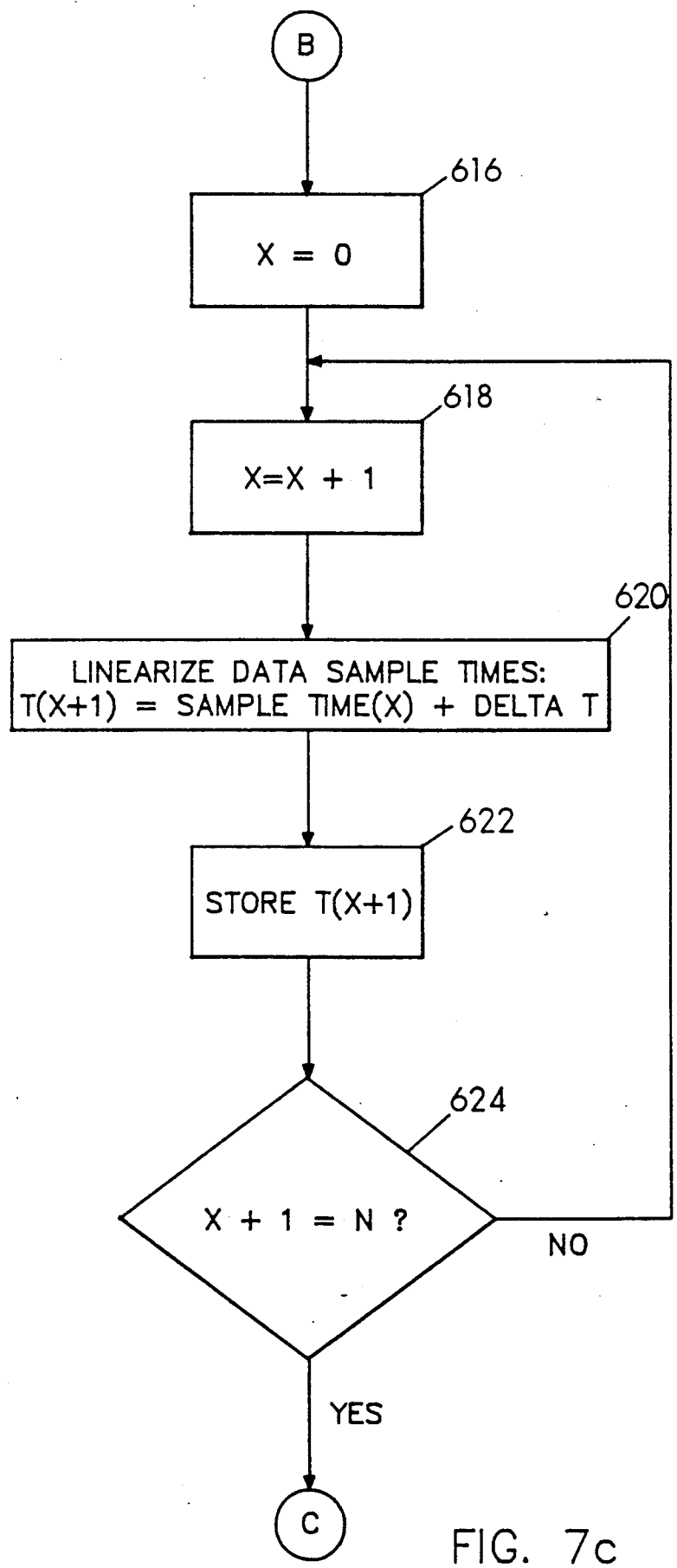
Figure 7D:
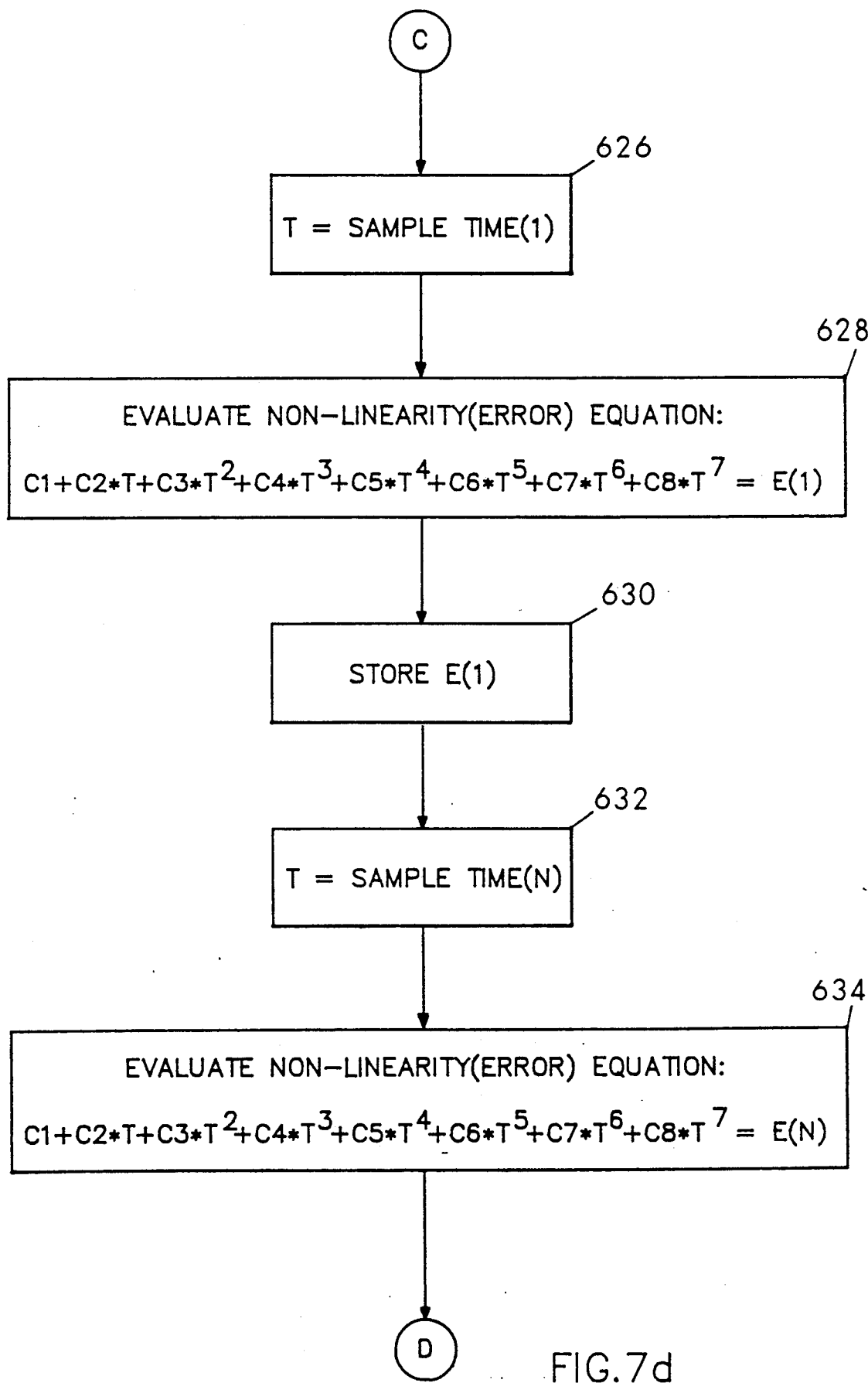
Figure 7E:
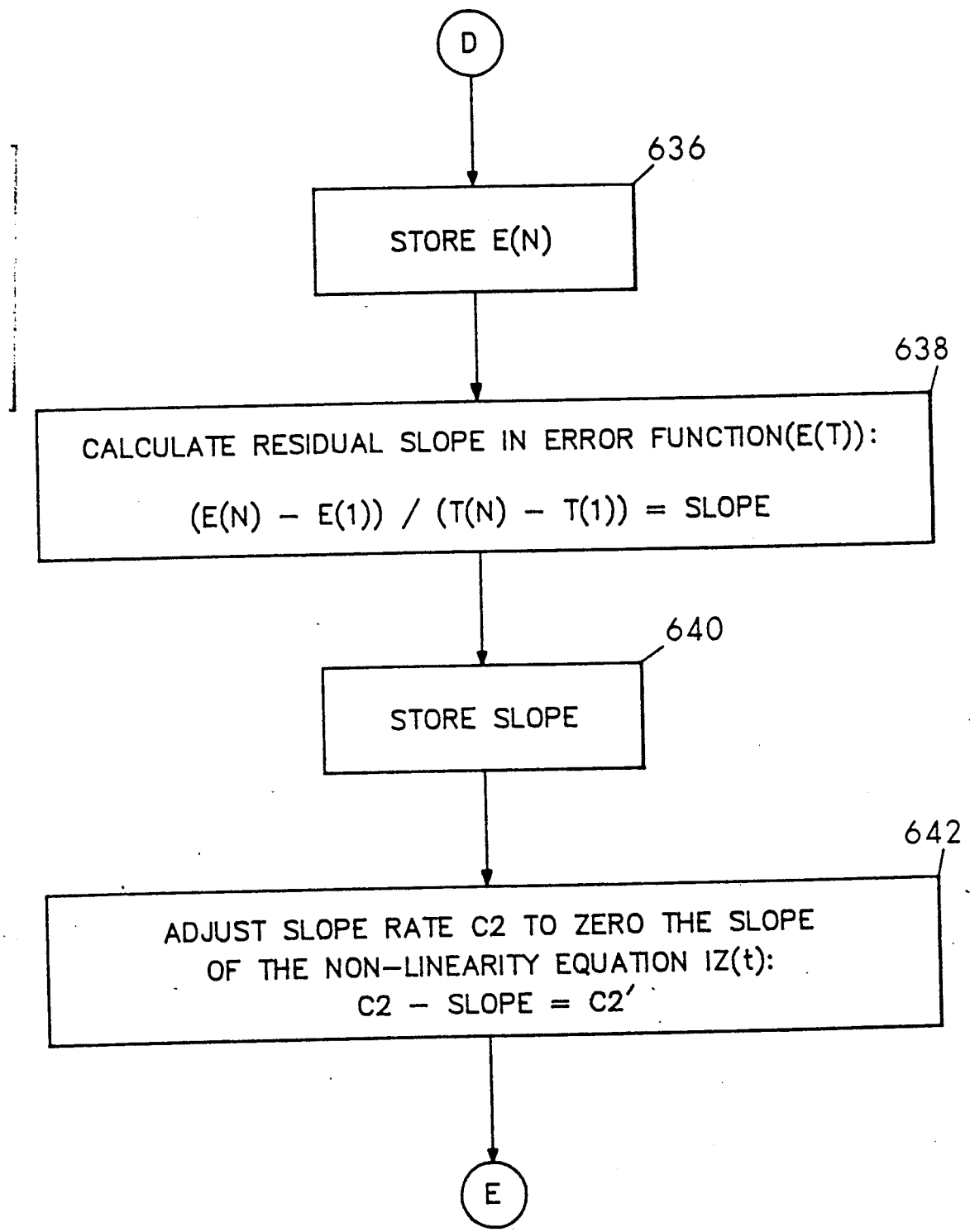
Figure 7F:
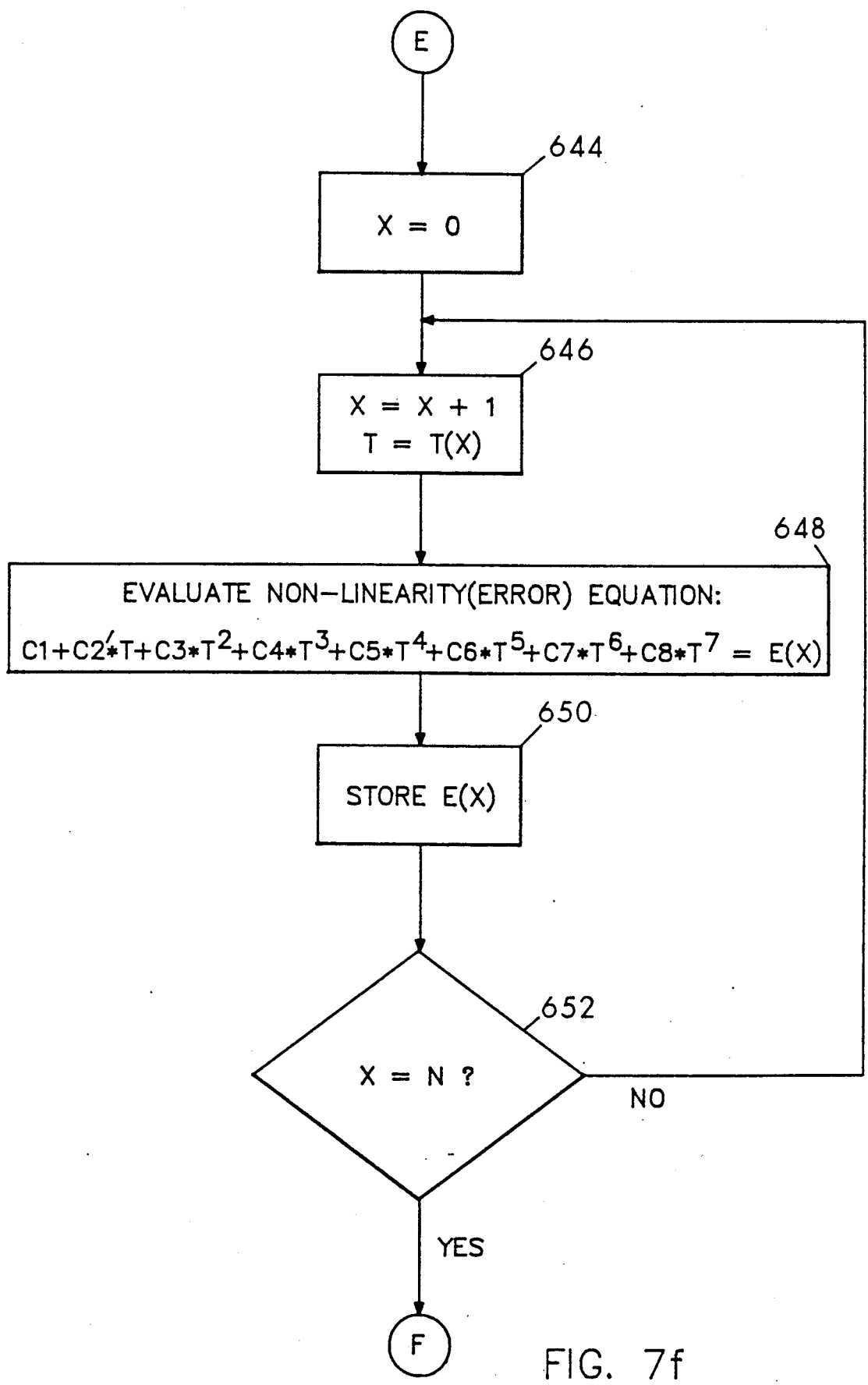
Figure 7G:
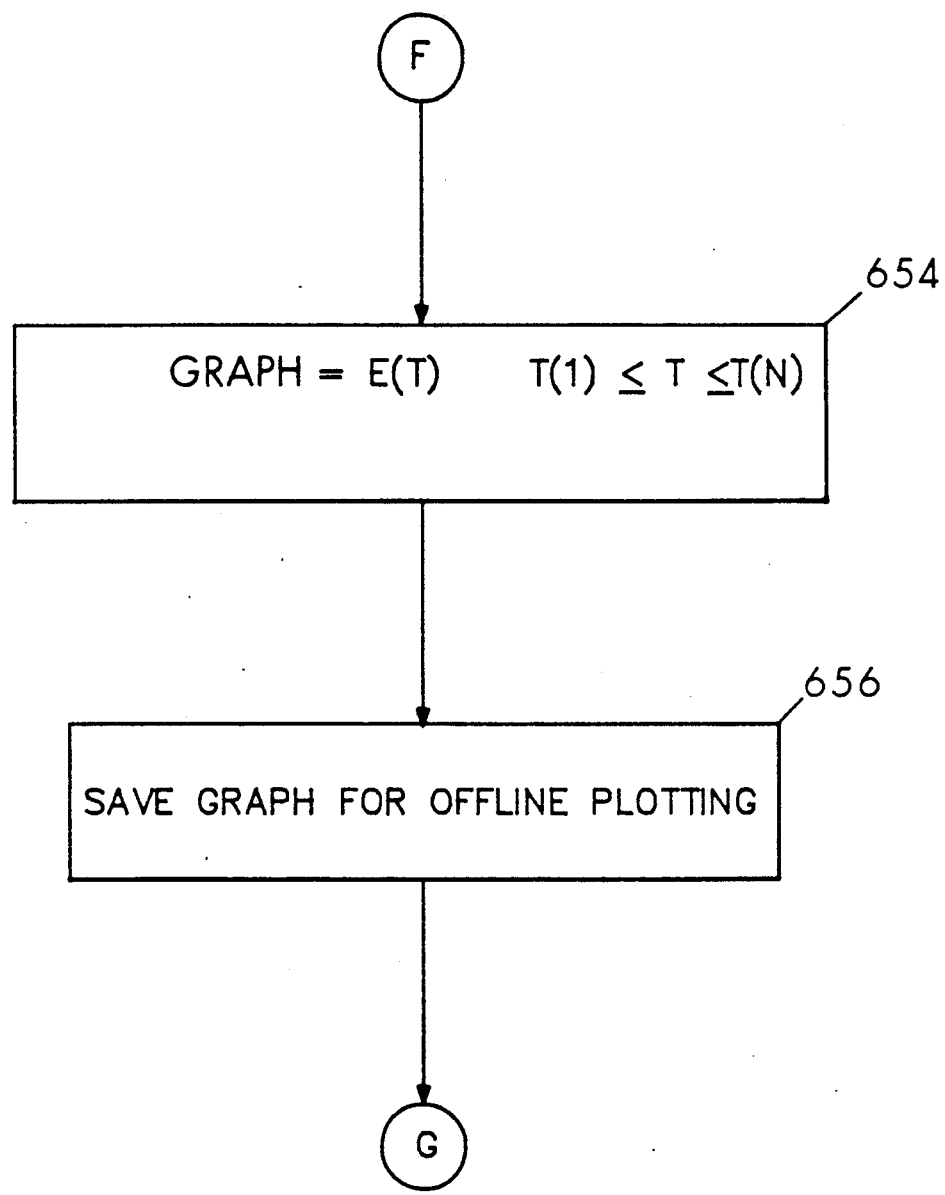
Figure 7H:
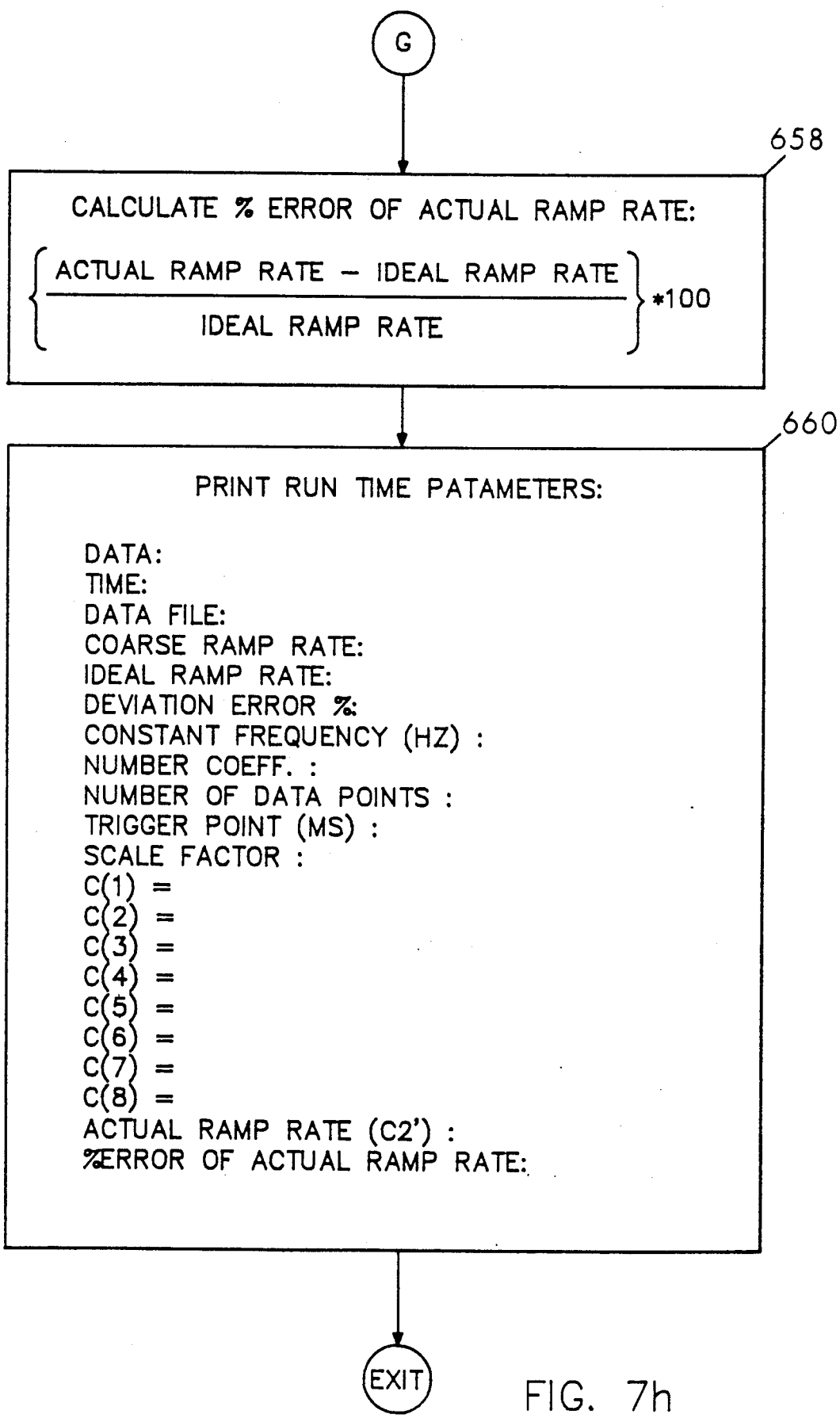

FIGS. 5a and 5b represent the program with the objective of formulating an 8×9 matrix that is used by the "CHLSKY" routine, represented by Blocks 502-510 of FIG. 6. The "CHLSKY" routine solves 8 simultaneous linear equations. As shown by Blocks 402 to 406, the program accomplishes the objective by first establishing a matrix Fi, which contains all the times, "TARG", from the table "HPDATA.ITB". Second, the individual "TARG" columns of the Fi matrix are raised to the power of the polynomial for which solution is desired, as represented by Block 408. For example, column 2 of the matrix is raised to the first power, column 3 is squared. Next, the contents of the Fi matrix (8 columns by N rows) is multiplied by its transpose and stored, as represented by Block 410. This effectively sums up the products of the polynomial from each data point and creates an 8×8 matrix. Next, the FARG matrix, which is a matrix that contains the frequency differences (non-linearities), is multiplied by the transpose of the Fi matrix, as represented by Block 412. This matrix is concatenated to the "A" matrix with 8 rows and 9 columns, as represented by Block 414. After this operation is performed, the "A" matrix contains eight simultaneous equations in eight unknowns. Effectively, a matrix that was 8 by an original number of data points (for example 300 data points) is reduced to an 8×9 matrix with a column of constants.

Blocks 502 to 510 of FIG. 6 represent the solution of the simultaneous non-homogeneous equations by a method of elimination. The elimination relies upon the principles of matrix algebra for formulation of upper (U) and lower (L) triangular matricies. These matricies are linearly related to the "A" matrix as L*U=A.

The formulas used in implementing the Choelsky method by solving simultaneous equations within the software are as follows:

$$A(i,j) = A(i,j)/A(i,1) \text{ for } j = 2,3,\ldots,n+1 \quad \quad 1.$$

$$A(i,j) = A(i,j) - \sum_{k=1}^{j-1} A(i,k) \cdot A(k,j) \quad \quad 2.$$

for $j = 2,3,\ldots,n$ and $i = j$,

-continued
j + 1, ..., n (for each j value)

$$A(i,j) = \left(A(i,j) - \sum_{k=1}^{i-1} A(i,k)^*A(k,j)\right)/A(i,i) \quad 3.$$

for i=2, 3, ..., n and j=i+1, i+2, ..., n+1 (for each i value).

After performing these operations, the coefficients of the least squares polynomial are determined by back substitution of the variables. The method of "back substitution" is described in detail on pages 149-151 in "Applied Numerical Methods for Digital Computation" third edition.

(h) Display

FIGS. 7a-7f are a functional flow diagram in computer program logic format, for the step for means 90 of displaying the curve. FIGS. 7a-7f particularly describe the signal flow for the steps of the process form of the invention. The objective of the process steps described by FIGS. 7a-7f is to accomplish the above-described steps of the invention.

Two disc files created by the curve fit routine are used. The first is called "HPDATA.PRN." This file contains two columns of data. The first column is the "time" at which each of the average frequency errors occured. These times are all relative to the first time entry in the column. The second column is the average frequency error for the time interval measured by the continuous counter. The average frequency error data is not used by this routine, but is provided for reference. The second disc file is "COEFFI.PRN." This file contains the calculated coefficients of the continuous function which best approximates the instantaneous frequency error data.

The routine shown in FIGS. 7a to 7f performs two primary functions. It evaluates the continuous function (non-linear equation) in equal increments of time over the measurement period and displays the resulting waveform. This continuous function is represented in its general form below.

$$y = C_1 + C_2 t^1 + C_3 t^2 + C_4 t^3 + C_5 t^4 + C_6 t^5 + C_7 t^6 + C_8 t^7$$

where $C_1$ through $C_8$ are coefficients from the "COEFFI.PRN" file.

The value of t is divided by 1000 to restore the original times from the units of milliseconds to seconds for compatibility with the equation above. This non-linearity equation is then evaluated for the first and last time entries of the disc file "HPDATA.PRN." The average slope (k") of this polynomial equation is then computed. This is done to provide a "fine" adjustment to the coarse slope (K') calculated in the routines within HPCOUNT (Block 218 of FIG. 3b). The fine adjustment is performed using the smoothed data and is computed as follows:

k" = ((value last) − (value first))/((((time last)/1000) − ((time first)/1000)))

This slope (k") is then subtracted from the coefficient $C_2$. Since $C_2$ represents the slope of the continuous function, subtracting k" from $C_2$ forces the continuous function to start and end at the to same ordinate value. This resultant value of $C_2$ is then used as a replacement for the original value of $C_2$. The continuous function equation is then evaluated at uniform increments of time throughout the measurement period as defined by the first and last time values. The resulting data is scaled, plotted, annotated and stored on disc for off line reproduction. The scaling and plotting are done by commercially available software routines. Various specific formats for the display can, therefore, be predetermined by the human operator. The peaks and valleys of the plot (maximum peak to peak frequency non-linearity) are visually evaluated by the human operator to determine the error associated with the measured signal.

(3) Experimental Results

Figure 10:
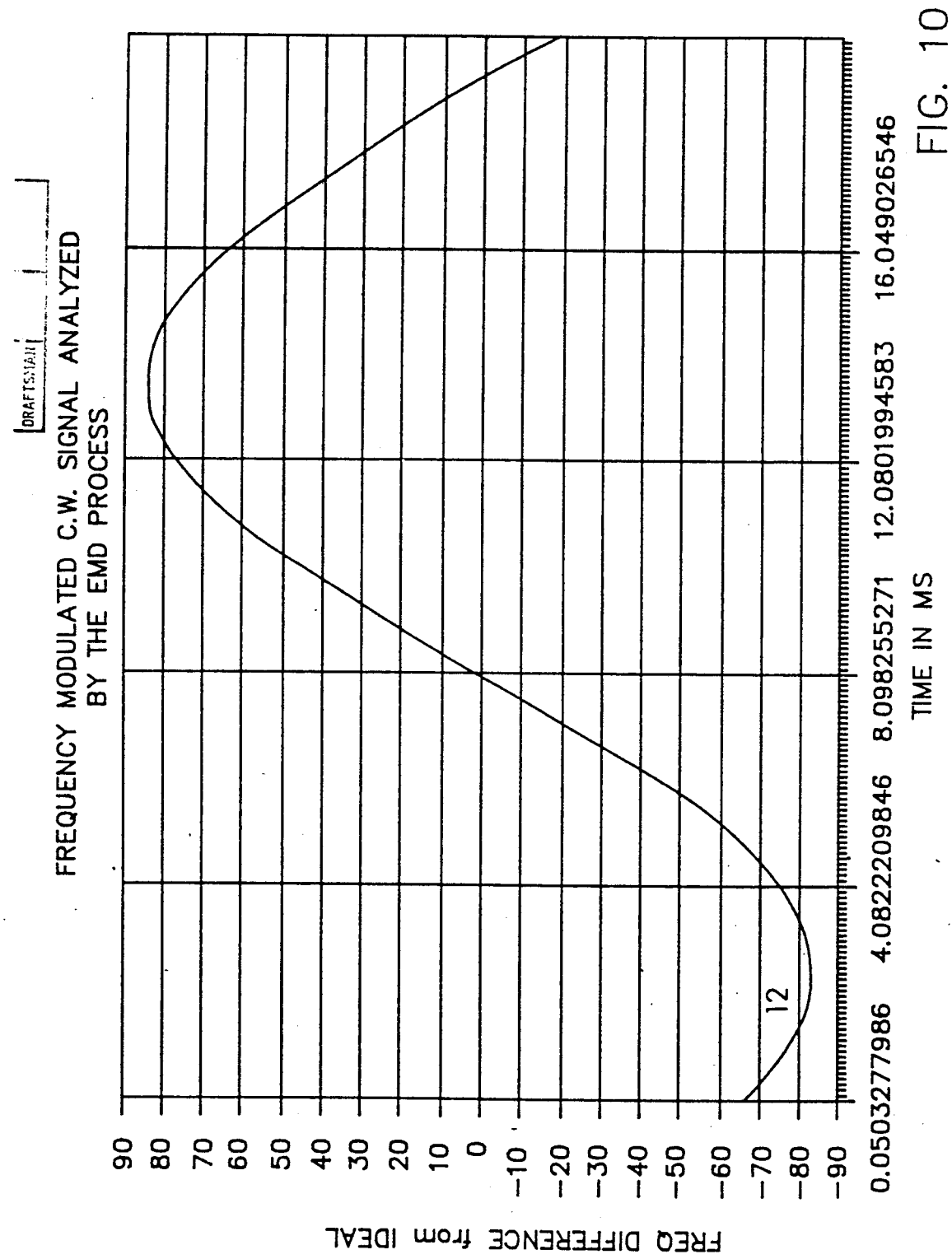
FIG. 10 is a graph illustrating experimental measurement results of testing the invention for a C.W. input signal from a unit under test with specific characteristics.

FIG. 10 is a graph which illustrates experimental measurement results of testing the invention for a C.W. input signal from a unit under test with characteristics.

Figure 11:
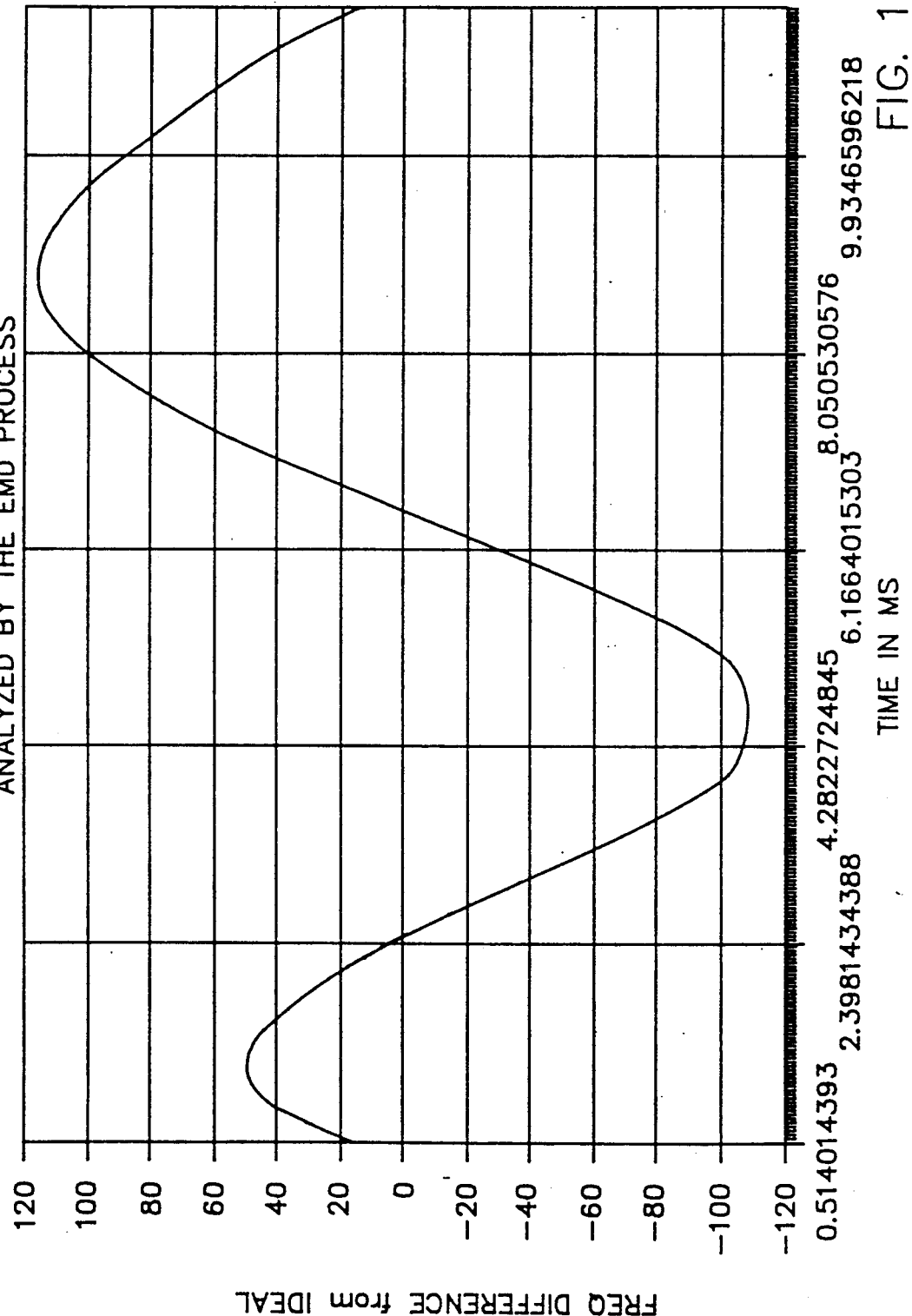
FIG. 11 is a graph illustrating experimental measurement results of testing the invention for a swept input signal from a unit under test with specific characteristics.

FIG. 11 is a graph which illustrates experimental results of testing the invention for a swept input signal from a unit under test with characteristics.

Figure 9:
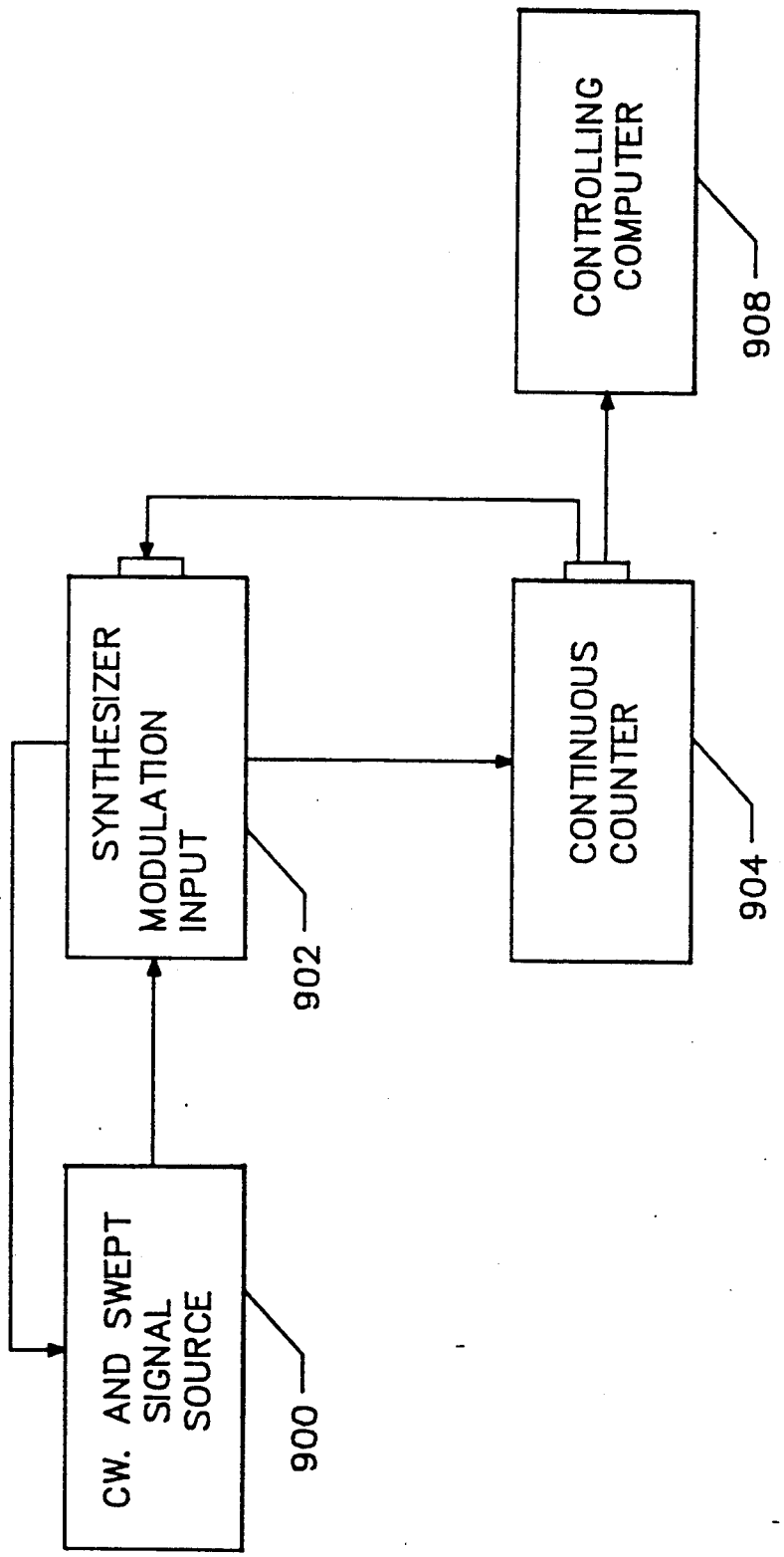
FIG. 9 is a block diagram representing the configuration used to experimentally test the invention.

In order to experimentally verify the operation of the invention, a physical model consisting of primarily commercial test equipment and a controlling computer was used. FIG. 9 represents the experimental configuration used. The function of synthesizer 902 is to simulate the signal output of a unit under test. This signal may be C.W. or swept. Signal source 900, which applies a signal to the modulation input of the synthesizer, simulates the excess modulation and non-linearities that may be present in the output signal of the unit under test. Continuous counter 904 provides the means of measuring contiguous time intervals of the unit under test signal. To control the process and provide the analytical processing needed to perform the final measurement required the use of controlling computer 908. Controlling computer 908 housed and executed all of the instrument control functions as well as the analysis routines.

An experiment was conducted in a controlled manner. One of the major problems to solve was the verification of results. This was primarily due to the unavailability of instrumentation that could make the same measurement. Therefore, a test procedure was adopted to help minimize this problem. The first step in this test procedure was to use frequency modulated C.W. signals. A modulating signal from signal source 900 was measured using an oscilloscope and a computation of the expected frequency deviation was made using the modulation transfer function of synthesizer 902. Therefore, the accuracy of the new process could be checked by comparing the output signal of the of modulating signal source 900 (voltage vs. time) with the output of the excess modulation detector (frequency vs. time). This is a valid procedure because the value of the instantaneous voltage of the modulating signal, at any point in time, is proportional to the frequency deviation at that same instant in time.

A 10 KHz C.W. signal was generated by synthesizer 902 and modulated by signal source 900. Signal source 900 produced a sinusoidal output signal voltage with a period of 22.2 milliseconds (or 45 Hz). The voltage deviation of this signal produced a frequency deviation in synthesizer 902 of ±84 Hz in the 10 KHz C.W. signal. This modulated signal was used as the unit under test signal and fed into continuous counter 904. Counter 904 measured the contiguous time intervals and passed the data to the controlling computer for final analysis. The results of the analysis were displayed as a frequency vs. time graph as shown in FIG. 10. As can be seen, the actual modulation (without the carrier) is displayed as a deviation from the carrier frequency. This was compared against the actual output of the modulating source and the process was found to accurately measure the modulation of the signal to within ±1 Hz of nominal. This proved that the basic concept, the hardware used, and the analysis routines were functional. The next step was to measure a compound modulated signal (a frequency modulated swept signal). In order to verify the results, a storage oscilloscope was used to store the modulation signal. If the process was accurate it would reveal a modulation pattern that was identical to the modulation signal. For this step, synthesizer 902 was programmed to produce a swept signal from 0 Hz to 50 KHz at a sweep rate of 4.5 MHz per second. The modulating signal was sinusoidal and generated from signal source 900 with a period of 8.333 milliseconds (120 Hz). The voltage of the modulating signal source was sufficient to produce a frequency deviation of 118 Hz in the swept signal. This composite signal was fed into continuous counter 904 which measured the contiguous time intervals and passed the data to controlling computer 908 for final analysis. The results of the analysis were displayed as a frequency vs. time graph as shown in FIG. 11. As can be seen, the actual modulation (without the carrier) is displayed as a deviation from the carrier frequency over time. This was compared against the modulating signal stored on the oscilloscope and the inventive process was found to accurately measure the modulation of the signal to within ±1 Hz of nominal. This proved that the inventive process could be used to measure the modulation and non-linearities of both C.W. and swept signals.

(4) Using the Invention

Referring to FIG. 8, the output swept signal of unit under test 1 is shown to be applied to the present invention for test. The human operator connects the unit under test hardware.

FIG. 8 represents the invention, testing a unit under test. The invention can have several embodiments depending upon the frequency and the type of signal being measured. That is, for all swept signals that are offset by a carrier, and for all C.W. signals with a frequency greater than 200 KHz, a down conversion stage is required. For swept signals that are at baseband, and in C.W. signals with a frequency less than or equal to 200 KHz, no down conversion stage is required.

As shown in FIG. 8 stable source 800 is used to drive the unit under test. Source 800 is not part of the invention but is required by the unit under test to function properly. Since the output signal of the unit under test is a swept signal that is offset by a carrier, a down conversion of the signal is required. Down conversion stage 800 consists of a phase locked loop. That is, the phased locked loop is used to null the carrier by locking onto it. The loop can be opened (under computer control), and the down conversion stage will revert to a simple mixer/oscillator stage. Automatic Gain Control (AGC) 812 is used to establish a fixed signal output level from the down converter. AGC 812 stage can also be programmed to revert to a fixed gain stage. The output signal from the AGC 812 stage is fed into a limiter stage 812 to provide a psuedo square wave input signal in slope/voltage trigger circuit 816. The output signal of trigger circuit 816 feeds signal conditioned square waves to counter 818 for measurement. This entire system is controlled by a high speed controlling computer. In addition, this computer also performs the final analysis and display of the results.

To use the invention, the following procedure would be followed assuming a configuration is shown in FIG. 8:

i) The controlling computer asks the human operator to supply important information before the process can be started. This information includes: nominal carrier frequency; C.W. or swept operation; sweep rate (if applicable).

ii) The output from the stable source is input into the unit under test and the unit under test is set to a C.W. mode. The output frequency of the unit under test is set to the carrier frequency that it will use during its swept operation.

iii) The synthesizer, in the phase locked loop stage, is set to a frequency to provide an output signal from the mixer, so that when mixed with the unit under test carrier signal, a frequency between 1 KHz and 50 KHz is generated. This phase locked loop itself should be programmed to the open loop mode (non-tracking).

iv) The output C.W. signal from the mixer is fed into the AGC circuit which automatically adjust the signal to the proper level. At this point the AGC circuit is programmed to revert back to a fixed gain amplifier with a gain setting based on its previous automated mode.

v) The next phase is to close the loop in the phase locked loop down-conversion stage. This results in the carrier from the unit under test being nulled at the output of the mixer. After this has been completed, the loop is then opened. This converts the phase locked loop back to a simple mixer/oscillator stage.

vi) At this point, the counter and trigger circuits are enabled and armed. The unit under test is then programmed to output its swept waveform for measurement. The swept waveform is then converted to baseband by the open loop mixer/oscillator stage and fed to the fixed gain AGC circuit. The output from this stage is limited and sent to the trigger/counter stage.

vii) The counter measures the contiguous time intervals of the swept signal and configures them into a table. The table is read by the controlling computer. The final analysis and display of the results are provided to the human operator user.

The above description describes certain preferred embodiments of the present invention, and it is contemplated that various modifications to the above can be effected, but nevertheless come within the scope of the present invention as defined by the claims.

I claim:

1. A process for signal analysis applied to swept or continuous signals which signals are output from a unit under test wherein said unit under test has a plurality of signals therein, which process for signal analysis generates prescribed parameters and predicted quantities, comprising the steps:

a. conditioning said swept or continuous output signals to be compatible for measurement;

b. measuring incremental cycle periods of said swept or continuous output signals by a continuous time counter;

c. data conditioning of the measured incremental cycle periods of said swept or continuous output signals;

d. calculating said prescribed parameters relating to said swept or continuous output signals based upon said measured incremental cycle periods;

e. aligning said calculated prescribed parameters with said predicted quantities;

f. computing incremental signal frequencies from said incremental cycle periods as measured;
g. calculating predicted incremental signal frequencies based upon said incremental cycle periods;
h. subtracting said incremental signal frequencies from said predicted incremental signal frequencies to form frequency residual quantities;
i. digitally filtering and generating signals representing a curve using said frequency residual quantities; and
j. using said digitally filtered and generated signals representing the curve to apply to other signals of said plurality of signals within said unit under test.

2. A process for signal analysis applied to swept or continuous signals with respective carrier frequencies, wherein said swept signals have a ramp characteristic from a unit under test which process for signal analysis generates prescribed parameters and predicted quantities, wherein said process for signal analysis comprises the steps:
   a. conditioning said swept or continuous signals to be compatible for measurement;
   b. measuring incremental cycle periods of said swept or continuous signals by a continuous time counter;
   c. data conditioning of the measured incremental cycle periods of said swept or continuous signals;
   d. calculating said prescribed parameters relating to said swept or continuous signals based upon said measured incremental cycle periods;
   e. aligning said calculated prescribed parameters with said predicted quantities;
   f. computing incremental signal frequencies from said incremental cycle periods as measured;
   g. calculating predicted incremental signal frequencies based upon said incremental cycle periods;
   h. subtracting said incremental signal frequencies from said predicted incremental signal frequencies to form a frequency residual quantity;
   i. digitally filtering and constructing a curve using said frequency residual quantities and said incremental signal frequencies; and
   j. displaying said curve.

3. The process of claim 2 wherein a prescribed parameter is carrier frequency of said continuous signals.

4. The process of claim 2 wherein said prescribed parameters are carrier frequency of said signal and slope of the ramp characteristic of said signal, for said swept signals.

5. The process of claim 2 wherein constructing said curve using said incremental signal frequencies is accomplishing by using a curve fitting method to construct said curve by employing the frequency residual quantities.

6. The process of claim 2 wherein the display of said curve is accomplished in a prescribed format.

7. The process of claim 2 wherein aligning said measured prescribed parameters with said predicted quantities is accomplished with a prediction model.

8. The process of claim 7 wherein said prediction model defines ideal behavior of said swept or continuous signals from said unit under test on an incremental cycle-by-cycle basis. whereby said prediction model employs calculation of incremental signal frequency vs. time prediction.

9. The process of claim 8 wherein the calculation of the residual frequency vs. time employs a method known as the Choelsky method.

* * * * *